(12) United States Patent
Tanaka et al.

(10) Patent No.: US 10,490,264 B2
(45) Date of Patent: Nov. 26, 2019

(54) SEMICONDUCTOR DEVICE

(71) Applicant: Renesas Electronics Corporation, Tokyo (JP)

(72) Inventors: Shinji Tanaka, Tokyo (JP); Makoto Yabuuchi, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/812,538

(22) Filed: Nov. 14, 2017

(65) Prior Publication Data
US 2018/0158513 A1 Jun. 7, 2018

(30) Foreign Application Priority Data

Dec. 1, 2016 (JP) .................................. 2016-234222

(51) Int. Cl.

| G11C 11/418 | (2006.01) |
|---|---|
| G11C 11/417 | (2006.01) |
| G11C 11/419 | (2006.01) |
| G11C 11/412 | (2006.01) |
| G11C 7/10 | (2006.01) |
| G11C 8/16 | (2006.01) |
| G11C 5/14 | (2006.01) |

(52) U.S. Cl.
CPC ............ *G11C 11/418* (2013.01); *G11C 5/145* (2013.01); *G11C 7/1075* (2013.01); *G11C 8/16* (2013.01); *G11C 11/412* (2013.01); *G11C 11/417* (2013.01); *G11C 11/419* (2013.01)

(58) Field of Classification Search
None
See application file for complete search history.

(56) References Cited

U.S. PATENT DOCUMENTS 4,506,350 A * 3/1985 Asano .................... G11C 16/08
365/185.21
2005/0237848 A1 10/2005 Takahashi et al.

FOREIGN PATENT DOCUMENTS

| JP | 2001-52485 A | 2/2001 |
| JP | 2003-273712 A | 9/2003 |

* cited by examiner

*Primary Examiner* — James G Norman
(74) *Attorney, Agent, or Firm* — Sughrue Mion, PLLC

(57) ABSTRACT

The semiconductor device includes a supply circuit for supplying a boosted voltage to a distal end of a wiring driven by a drive signal. The supply circuit includes an inverter circuit having an input coupled to the wiring, and a switch element controlled by an output signal of the inverter circuit. The switch element couples the boosted voltage to the distal end of the wiring.

9 Claims, 14 Drawing Sheets

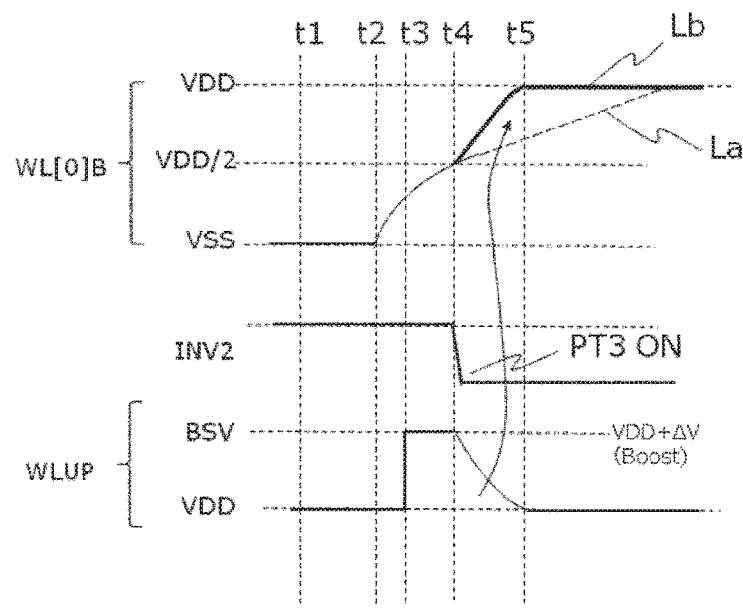

SEMICONDUCTOR DEVICE

CLAIM OF PRIORITY

The present application claims priority from Japanese Patent application JP 2016-234222 filed on Dec. 1, 2016, the content of which is hereby incorporated by reference into this application.

BACKGROUND

The disclosure relates to a semiconductor device. More particularly, the disclosure is applicable to a semiconductor integrated circuit device including a storage device such as a static random access memory (SRAM).

Japanese Unexamined Patent Application Publication No. 2003-273712 discloses the semiconductor storage device including a word line drive circuit which inputs a constant voltage independent from the supplied power supply voltage as boosted voltage (VBOOST), and drives the selected word line at the constant voltage.

Japanese Unexamined Patent Application Publication No. 2001-52485 discloses the static RAM of hierarchical word line type. The word line includes a main word line and a sub word line.

SUMMARY

Upon application of the disclosure of Japanese Unexamined Patent Application Publication No. 2003-273712 to the word line of the static random access memory, it is necessary to pay attention to data destruction of the memory cell owing to the static noise margin (SNM).

The hierarchical word line type as disclosed in Japanese Unexamined Patent Application Publication No. 2001-52485 requires coupling between the global word line and the local word line. It is necessary to pay attention to the increase in the circuit area.

It is an object of the disclosure to provide the semiconductor device capable of lessening unsharpness of the signal waveform under the influence of the wiring parasitic resistance or the load capacity.

Any other task and new features will be clarified by the description of the specification, and drawings.

The representative feature disclosed herein will be briefly described.

The semiconductor device includes a supply circuit for supplying a boosted voltage to a distal end of a wiring driven by a drive signal. The supply circuit includes an inverter circuit having an input coupled to the distal end of the wiring, and a switch element to be controlled by an output signal of the inverter circuit. The switch element couples the boosted voltage to the distal end of the wiring.

The above-described semiconductor device is capable of lessening unsharpness of the signal waveform.

BRIEF DESCRIPTION OF THE DRAWINGS

FIG. 12 is a waveform chart for explaining potential at a distal end B of a word line WL [0];

FIG. 13 is a view showing an exemplary setting of capacitive elements CAP1 and CAP2 as shown in FIG. 10;

DETAILED DESCRIPTION

Figure 1A:
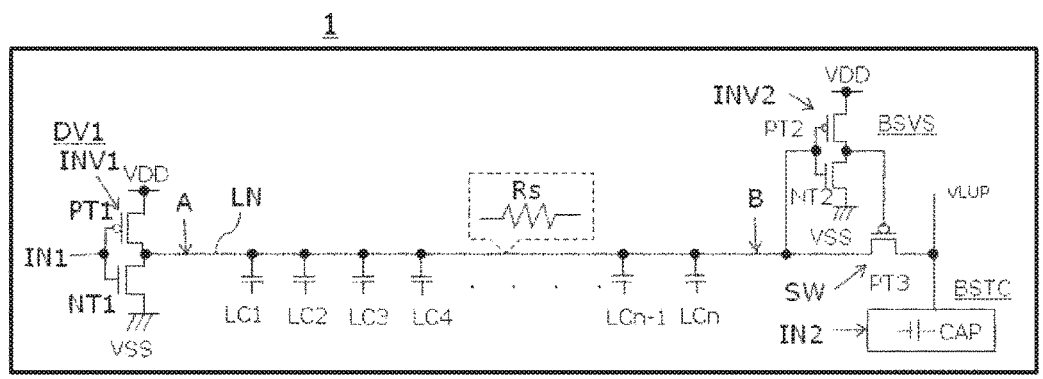
FIG. 1A is an explanatory view of a semiconductor device according to a first embodiment.

The insulation gate type field effect transistor for the semiconductor device, that is, MOS transistor (MOSFET) has contributed to refinement of the manufacturing process as well as improvement of the process, showing that the supply current tends to be less likely to fall. On the contrary, the parasitic resistance of the signal wiring made of metal for signal transmission hardly varies in spite of the refined process. Therefore, the influence of the parasitic resistance component of the signal wiring tends to be relatively higher than the operation speed. As the generation (refinement of the manufacturing process) of the semiconductor device progresses, the target value of the operation frequency becomes higher. Therefore, it is necessary to implement the technique for circuit acceleration in consideration of the influence of the parasitic resistance of the signal wiring.

Embodiments and examples will be described referring to the drawings. The element with the same structure will be designated with the same code, and explanation thereof, thus will be omitted. For the purpose of clarifying the explanation, there may be the case that width, thickness, and configuration of the respective elements as shown in the drawings are schematically expressed relative to those of the actual embodiment. Such expression, however, is a mere example with no intention to restrict the present invention.

First Embodiment

Figure 1B:
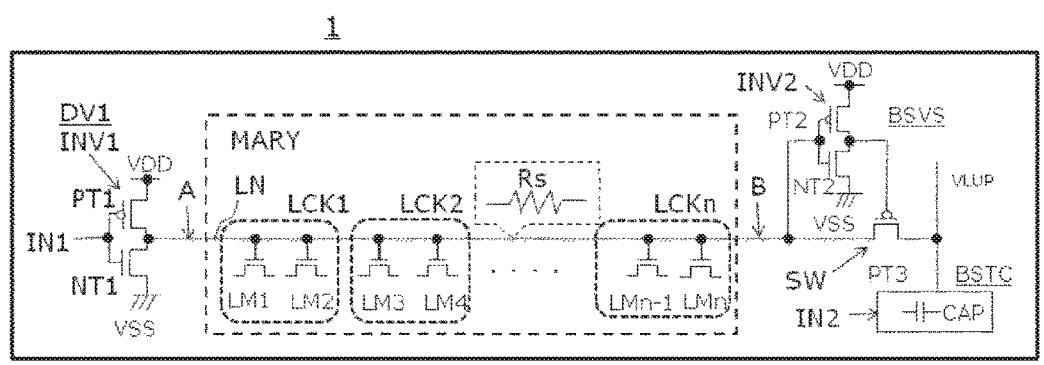
FIG. 1B is an explanatory view of a semiconductor device according to a second embodiment.

FIGS. 1A and 1B are explanatory views of a semiconductor device according to embodiments. A semicondevice 1 is a semiconductor integrated circuit device formed for a single semiconductor chip. The semiconductor device 1 includes a drive circuit DV1, a signal wiring LN made of metal, which is driven by the drive circuit DV1, a boosted potential supply circuit BSVS, a boosting circuit BSTC, and a boosted potential node wiring VLUP.

The drive circuit DV1 includes a first CMOS inverter circuit INV1 for receiving an input of a first input signal IN1 in a non-restricted manner. The inverter circuit INV1 includes a P channel MOSFET PT1 and an N channel MOSFET NT1 having source-drain paths directly coupled between a first power supply voltage VDD and a second power supply voltage (ground potential) VSS at the potential lower than the first power supply voltage VDD. The P channel MOSFET PT1 and the N channel MOSFET NT1 receive the input signal IN1 at gate electrodes as input terminals, and output an output signal from a common drain electrode as an output terminal. The output signal is used for driving the signal wiring LN.

The signal wiring LN includes a proximal end (one end) and a distal end (the other end). The signal wiring LN having a parasitic resistance Rs is coupled to a plurality of load capacities LC1 to LCn. The proximal end A of the signal wiring LN denotes the part coupled to an output terminal of the drive unit DV1, that is, the output terminal of the inverter circuit INV1 as shown in FIGS. 1A and 1B (specifically, drain region of the MOSFET PT1 or NT1), or the part of the signal wiring LN around the coupled part. Meanwhile, the distal end B of the signal wiring LN denotes the part at which the signal wiring LN is coupled to an input terminal of the boosted potential supply circuit BSVS (specifically, gate electrode of the MOSFET PT2 or NT2, or source region of the MOSFET PT3, which will be described later), or the part of the signal wiring LN around the coupled part.

The boosting circuit BSTC is a voltage boosting circuit of capacitance coupling type, and includes a boot capacitive element CAP for boosting purpose. Upon reception of a second input signal IN2 in synchronization with the first input signal IN1, the boosting circuit BSTC generates a boosted potential BTV by means of the boot capacitive element CAP based on the second input signal IN2. The boosted potential BTV is higher than the first power supply voltage VDD, and supplied to a boosted potential node wiring VLUP. The boosted potential BTV is equal to or higher than the first power supply voltage VDD, but is not very high.

The boosted potential supply circuit BSVS includes a second CMOS inverter circuit INV2 having inputs coupled to the distal end B of the signal wiring LN, and a switch element SW which is controlled by the output signal of the inverter circuit INV2 for coupling the boosted potential BTV that has been supplied to the boosted potential node wiring VLUP to the distal end B of the signal wiring LN.

The inverter circuit INV2 includes a P channel MOSFET PT2 and an N channel MOSFET NT2 having a source-drain path directly coupled between the first power supply voltage VDD and the second power supply voltage (ground potential) VSS. The P channel MOSFET PT2 and the N channel MOSFET NT2 receive the input signal IN2 from gate electrodes as input terminals, and output an output signal from a common drain electrode as the output terminal. The output signal is used for controlling the switch element SW.

The switch element SW as a MOS switch element includes the P channel MOSFET PT3 in the non-restricted manner. The P channel MOSFET PT3 includes a gate electrode coupled to the output terminal of the inverter circuit INV2, and the source-drain path for coupling the boosted potential BTV supplied to the boosted potential node wiring VLUP to the distal end B of the signal wiring LN.

The explanation will be made with respect to operations, specifically, those of the drive circuit DV1 for driving the signal wiring LN from the low level like VSS to the high level like VDD based on the input signal IN1.

The drive circuit DV1 varies the level at the proximal end A of the signal wiring LN from low to high based on the input signal IN1. Upon reception of the second input signal IN2 in synchronization with the first input signal IN1, the boosting circuit BSTC generates the boosted potential BTV based on the second input signal IN2. The parasitic resistance Rs and the load capacities LC1 to LCn which exist between the proximal end A and the distal end B of the signal wiring LN will delay propagation of the signal level change from the proximal end A to the distal end B of the signal wiring LN. If the signal level at the distal end B of the signal wiring LN becomes intermediate between low and high, that is, the signal level at the distal end B exceeds a logical threshold of the inverter circuit INV2, the output signal level of the inverter circuit INV2 will be changed from high to low.

As the gate electrode of the P channel MOSFET PT3 as the switch element SW is brought into the low level, the P channel MOSFET PT3 becomes ON so that the boosted potential BTV of the boosted potential node wiring VLUP is coupled and supplied to the distal end B of the signal wiring LN via the source-drain path of the P channel MOSFET PT3. As a result, the signal level at the distal end B of the signal wiring LN is raised to be high by the boosted potential BTV.

The signal at the distal end B of the signal wiring LN is brought into the high level in the similar way to the first power supply voltage VDD of the inverter circuit INV1. As the inverter circuit INV1 is coupled to the power supply voltage VDD, the high potential level at the distal end B of the signal wiring LN is not raised to the boosted potential BTV so as to be kept at the potential level of the power supply voltage VDD. For example, assuming that the signal level at the distal end B of the signal wiring LN becomes equal to or higher than the potential of the VDD, the potential equal to or higher than the power supply voltage VDD will be absorbed into the first power supply voltage VDD as the low-impedance power supply because of ON state of the P channel MOSFET PT1 of the inverter circuit INV1.

The semiconductor device according to the first embodiment is capable of lessening unsharpness of the signal waveform effected by the parasitic resistance and the load capacity of the wiring by means of structures of the boosted potential supply circuit BSVS and the boosting circuit BSTC. This makes it possible to provide the semiconductor device configured to be operated at higher operation speeds while avoiding increase in the circuit area.

Second Embodiment

FIG. 1B is an explanatory view of the semiconductor device according to the second embodiment. The semiconductor device of the second embodiment is formed by applying the one as shown in FIG. 1A to the storage device built in the semiconductor device 1, for example, static random access memory (SRAM). The part different from the one as shown in FIG. 1A will be described.

A memory array MARY is disposed between the proximal end A and the distal end B of the signal wiring LN. Referring to FIG. 1B, the load capacities LC1 to LCn as shown in FIG. 1A are replaced with load MOSFETs LM1, LM2, LM3, LM4, . . . , LMn−1, LMn. The gate electrodes corresponding to the MOSFETs LM1, LM2, LM3, LM4, . . . , LMn−1, LMn are coupled to the signal wiring LN. The MOSFETs LM1, LM2 are contained in a circuit LCK1. The MOSFETs LM3, LM4 are contained in a circuit LCK2, and MOSFETs LMn−1, LMn are contained in a circuit LCKn.

Figure 2:
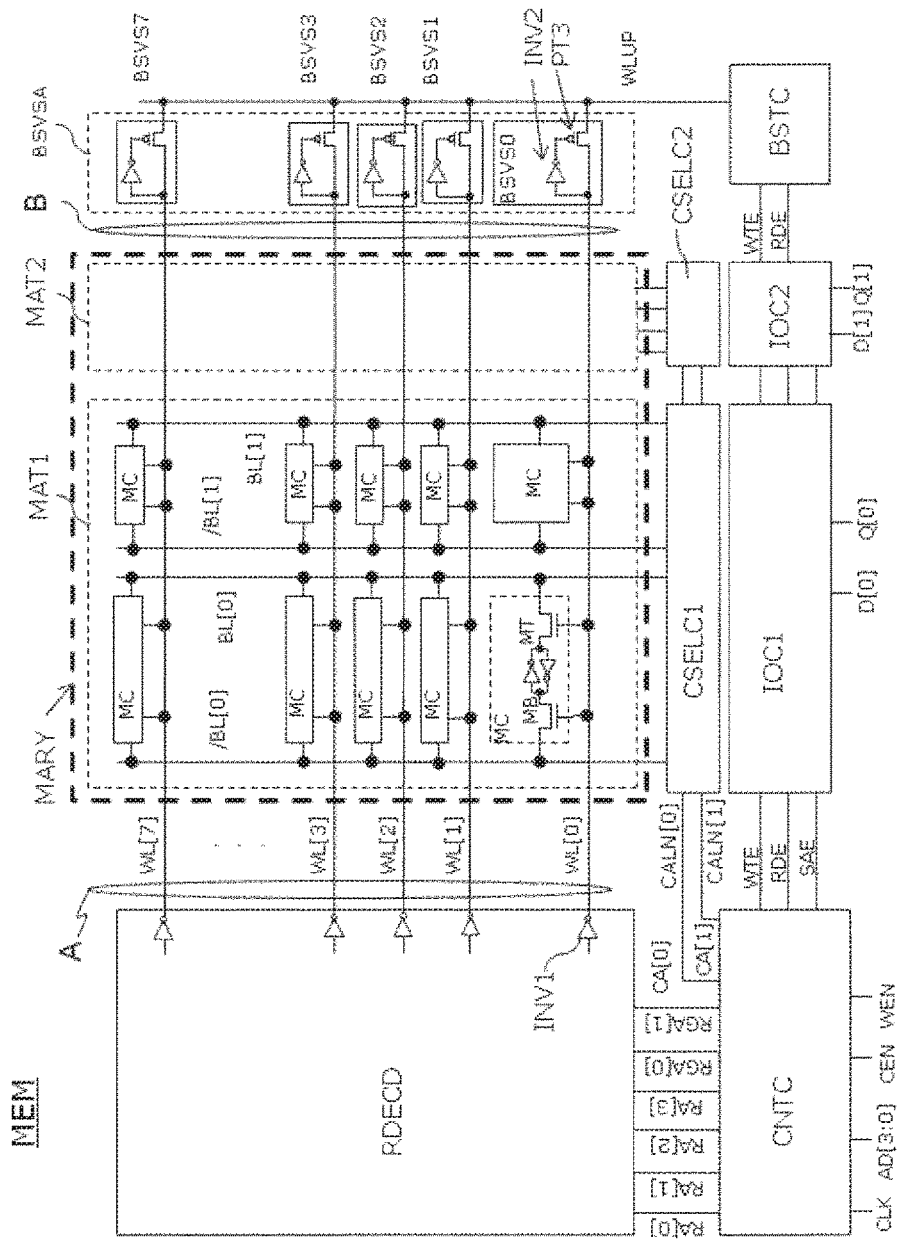
FIG. 2 is a block diagram of a storage device according to a first example.
Figure 4:
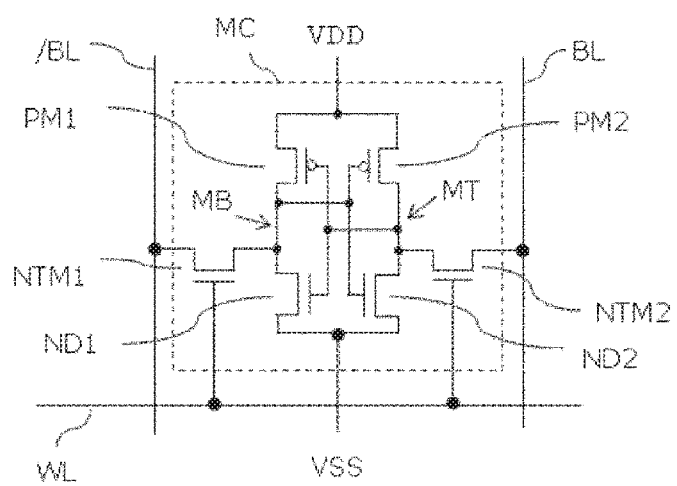
FIG. 4 is a view showing a structure of a memory cell MC as shown in FIG. 2.

The explanation will be made with respect to the case that the signal wiring LN is the word line (FIG. 2 shows word lines WL [0] to WL [7] as described below). Each of the circuits LCK1, LCK2, . . . , LCKn is designated as the memory cell MC. Each of the load MOSFETs LM1, LM2, LM3, LM4, . . . , LMn−1, LMn is designated as the selection MOSFET inside the memory cell MC (FIG. 4 shows NTM1, NTM2). The drive circuit DV1 is designated as a row selection drive circuit (FIG. 2 shows a word line driver). The input signal IN1 is designated as a row line selection signal, and the input signal IN2 is designated as a read control signal (RDE) or write control signal (WTE) in synchronization with the word line selection signal.

Figure 9:
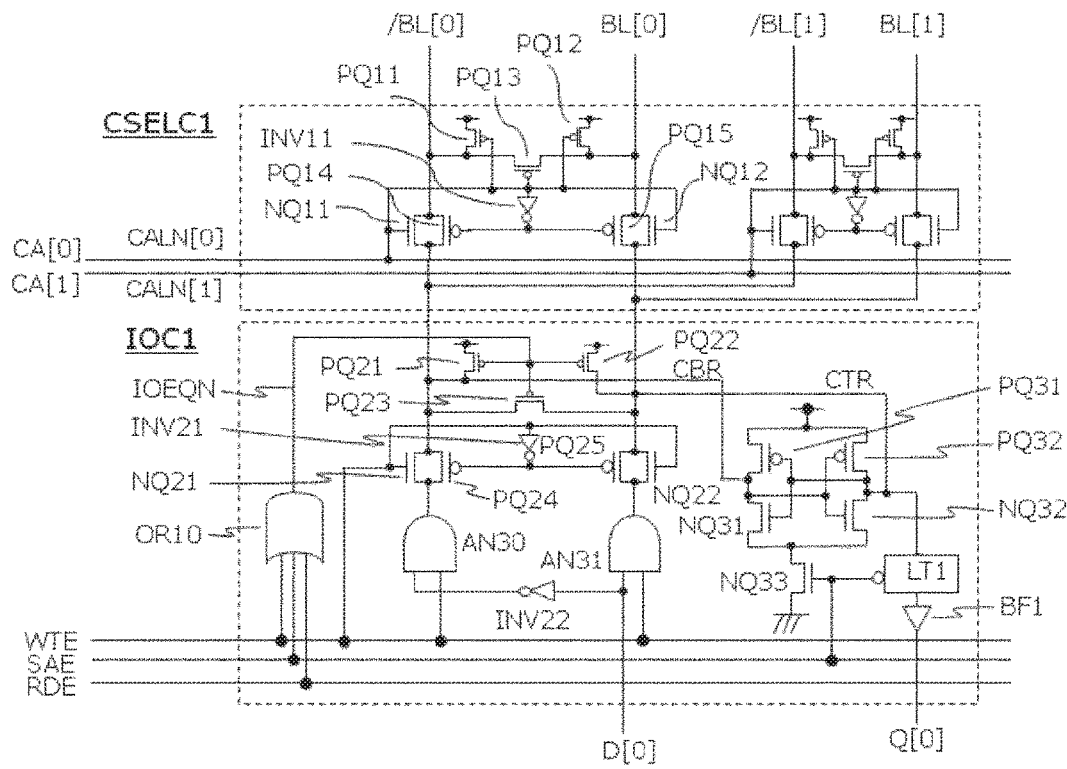
FIG. 9 is a view showing a structure of a column selection circuit and an I/O control circuit as shown in FIG. 2.
Figure 15:
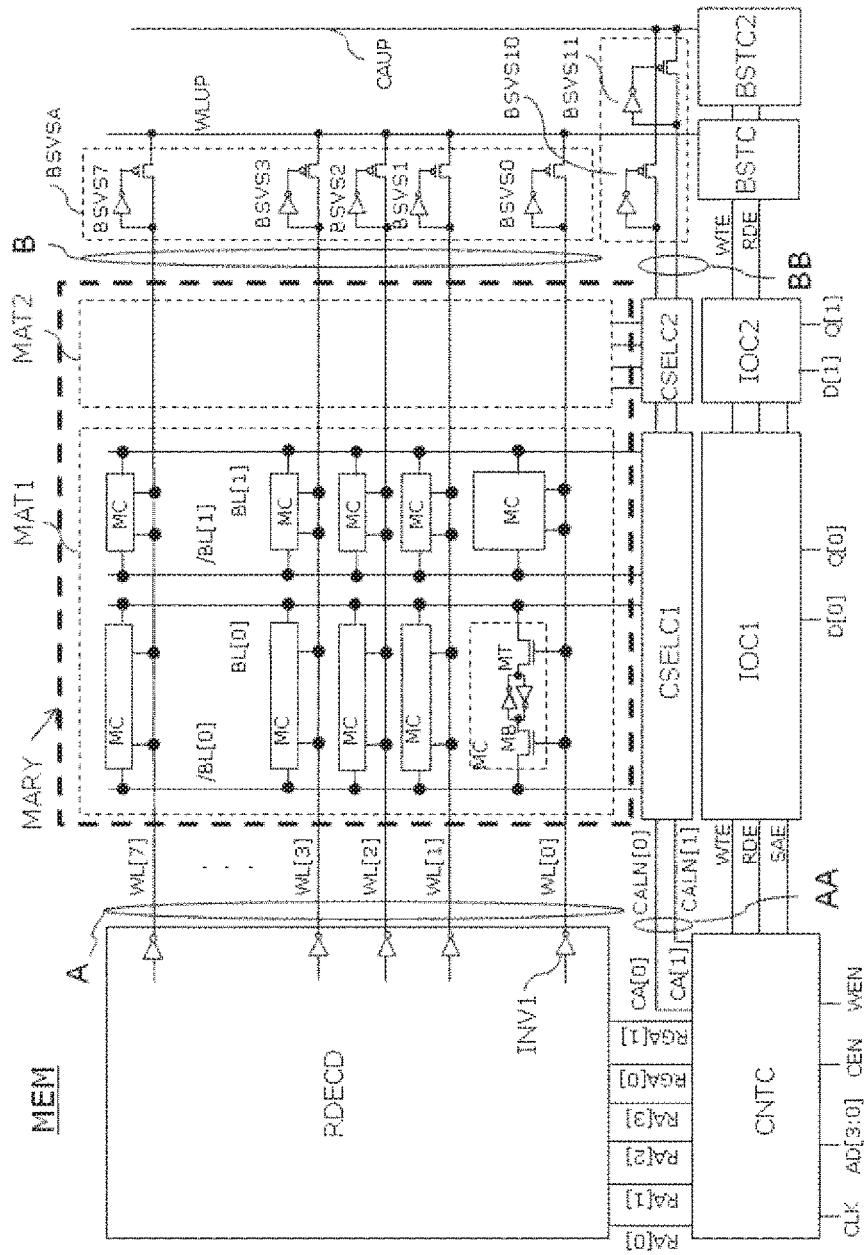
FIG. 15 is a block diagram of the storage device according to a second example.
Figure 16A:
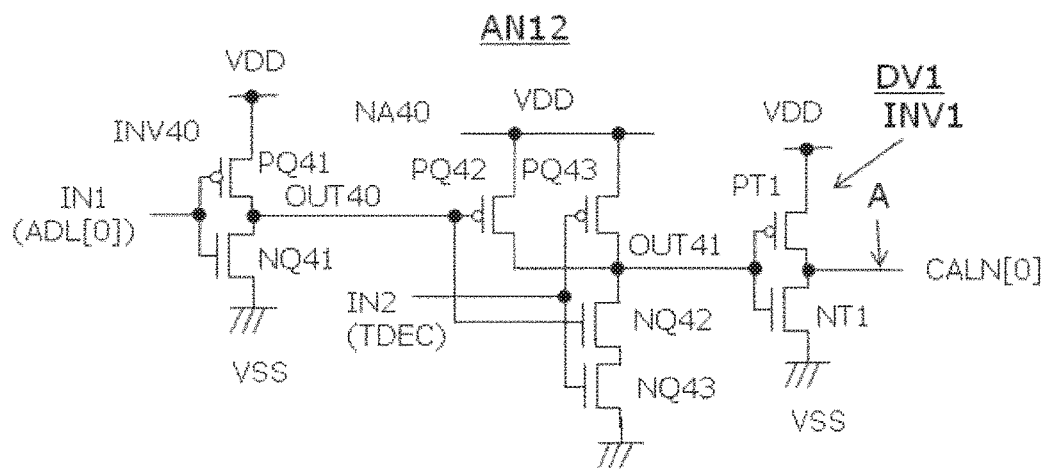
FIG. 16A is a view showing a structure of an AND circuit 12 as shown in FIG. 6.
Figure 16B:
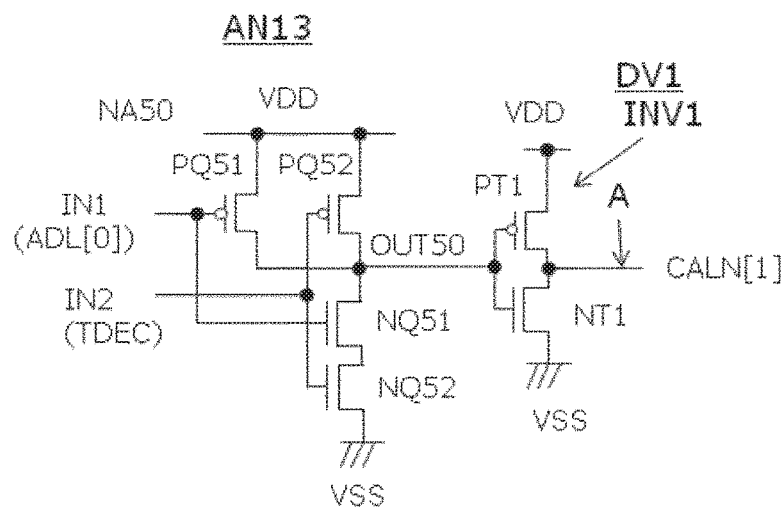
FIG. 16B is a view showing a structure of an AND circuit 13 as shown in FIG. 6.

The explanation will be made with respect to the case that the signal wiring LN is a column selection line (FIGS. 9 and 15 show column selection lines CALN [0], CALM [1]). The circuits LCK1, LCK2, . . . , LCKn are designated as row selection circuits (column selection circuits CSELC1, CSELC2 as described below). The load MOSFETs LM1, LM2, LM3, LM4, . . . , LMn−1, LMn are designated as column selection MOSFETs (FIG. 9 shows NQ 11, NQ 12, PQ 14, PQ 15 as described below), a pre-charge circuit, and an equalize circuit (FIG. 9 shows PQ 11, PQ 12, PQ 13, INV 11). The drive circuit DV1 is designated as the drive circuit of the column selection line (FIGS. 16A, 16B show the column line driver as described below). The input signal IN1 is the column selection signal, and the input signal IN2 is the read control signal (RDE) or the write control signal (WTE) in synchronization with the column selection signal.

The memory array MARY of the static random access memory (SRAM) built in the semiconductor device 1 is configured to have a plurality of memory cells MC arranged in a matrix. The word line or the column selection line is formed into a relatively long wiring. The parasitic resistance and the load capacity are set to have relatively large values.

If the wiring LN is the word line, the parasitic resistance and the load capacity will delay the propagation of change in the signal level at the proximal end (one end) A of the wiring LN to the distal end (the other end) B. As described in the first embodiment, structures of the boosted potential supply circuit BSVS and the boosting circuit BSTC may raise the signal level at the distal end B of the wiring LN to high by the boosted potential BTV. As a result, the word line selection may be accelerated. The potential level at the distal end B raised by the boosted potential BTV will not reach the boosted potential BTV, but kept at the potential level of the power supply voltage VDD. This makes it possible to prevent disruption of the memory cell data caused by the static noise margin (SNM).

Likewise, if the wiring LN is the column selection line, structures of the boosted potential supply circuit BSVS and the boosting circuit BSTC will raise the signal level at the distal end B of the wiring LN to high by the boosted potential BTV, thus accelerating a selecting operation of the row selection circuit.

First Example

FIG. 2 is a block diagram of the storage device according to the first example.

Figure 3:
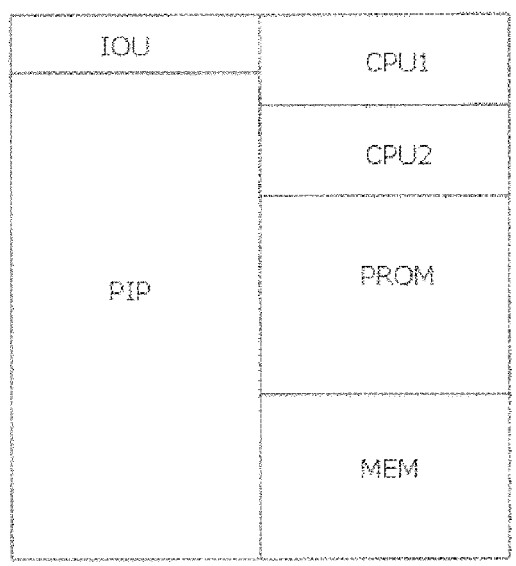
FIG. 3 is a schematic view showing an overall structure of the semiconductor device.

FIG. 3 is a schematic view showing an overall structure of the semiconductor device.

The semiconductor device as shown in in FIG. 3 will be described. FIG. 3 shows the semiconductor device or the semiconductor integrated circuit device (LS1) 1 called SOC (System On a Chip) having various logic circuits and the storage device formed over the single semiconductor chip such as single crystal silicon. The semiconductor device 1 as an LSI for controlling automobile, for example, includes two processor units CPU1, CPU2, a storage device MEM, a program memory PROM, various logic circuits (peripheral logic circuit) PIP, and an I/O unit IOU. The exemplary structure as shown in FIG. 2 applies to the storage device MEM of the semiconductor device.

The CPU 1, CPU 2 execute a predetermined arithmetic processing based on the program stored in the program memory PROM. The PIP serves to execute the signal received from the sensor, generate the signal for controlling the actuator, and transmit/receive the signal to/from the onboard network (CAN, LIN). The IOU serves as the I/O interface with the outside. The storage device MEM as a primary data storage region is appropriately accessed in association with processing of each circuit block. The storage device MEM of the semiconductor device 1 such as the SOC is often designed with the automatic design tool called memory compiler and the like using the design data called, for example, memory IP (Intellectual Property) and the like.

The storage device MEM as shown in FIG. 2 is the static random access memory (SRAM). FIG. 2 schematically shows the storage device for simplifying the drawing. It is possible to vary the number of the memory cells MC, the number of the word lines WL, and the number of complementary data line pairs (/BL, BL).

The storage device MEM includes the memory array MARY having the memory cells MC arranged in a matrix. The memory array MARY includes memory mats MAT1 and MAT2 in a non-restricted manner. The explanation of the memory cell MC in the memory mat MAT2 with the same structure as that of the memory mat MAT1 is omitted for simplification.

Each of the memory cells MC arranged for the respective rows in the memory mat MAT1 is coupled to a corresponding one of the word lines extending in the first direction, WL [0], WL [1], WL [2], . . . , WL [7]. Each of the memory cells MC arranged for the respective rows is coupled to the corresponding single pair of the complementary bit lines of /BL[0], BL[0], and /BL [1], BL [1], which extend in the second direction intersecting the first direction.

The row selection drive circuit RDECD selects the corresponding one of the word lines WL [0], WL [1], WL [2], . . . , WL [7] in accordance with internal row address signals RA [0], RA [1], RA [2], RA [3], RGA [0], RGA [1].

The column selection circuit CSELC1 is disposed for selecting the corresponding pair of complementary bit lines among those /BL [0], BL [0], and /BL [1], BL [1] in accordance with internal column address signals CA [0], CA [1]. The column selection circuit CSELC2 including the function similar to that of the column selection circuit CSELC1 is disposed for the memory mat MAT2.

The I/O control circuit IOC1 controls writing/reading of data to/from the memory cell MC coupled to the single word line selected by the row selection drive circuit RDECD, and to the complementary bit line pair selected by the column selection circuit CSELC1. The I/O control circuit IOC1 receives an internal write enable signal WTE as an internal write control signal (write pulse signal), an internal read enable signal RDE as an internal read control signal (read pulse signal), and an internal sense amplifier enable signal as the internal sense amplifier activation signal from a control circuit CNTC. The data Din0 selected and written into the memory cell are input from a data input terminal D [0]. The data Dout0 selected and read from the memory cell are output from a data output terminal Q [0]. An I/O control circuit IOC2 having the function similar to that of the I/O control circuit IOC1 is disposed for the memory mat MAT2, and includes a data input terminal D [1], and a data output terminal Q [1].

The control circuit CNTC receives a clock signal CLK, a 4-bit address signal AD [3:0], a chip enable signal CEN, and a write enable signal WEN. The control circuit CNTC generates the internal row address signals RA [0], RA [1], RA [2], RA [3], RGA [0], RGA [1], the internal column address signals CA [0], CA [1], the internal write enable signal WTE, an internal read enable signal RDE, and the internal sense amplifier enable signal SAE. The internal column address signals CA [0], CA [1] are supplied to the column selection lines CALN [0], CALN [1], respectively.

The storage device MEM as shown in FIG. 2 is configured through the compiled memory design technique. Referring to FIG. 2, the memory mat MAT1, the column selection circuit CSELC1 and the I/O control circuit IOC1 are combined into the single unit. This unit is disposed with repetition to provide the memory mat MAT2, the column selection circuit CSELC2, and the I/O control circuit IOC2. In the above-described case, there are two units so that 2-bit data are input and output. The bit number of data may be set to 8, 16, and 32 through repetitive provision of the units 8 times, 16 times, and 32 times, respectively. It is possible to vary the number of the word lines, and the number of the complementary data line pairs for the single unit including the memory mat MAT1, the column selection circuit CSELC1 and the I/O control circuit IOC1.

The storage device MEM (SRAM) as shown in FIG. 2 further includes the boosting circuit BSTC, the boosted potential node wiring WLUP, and a boosted potential supply circuit array BSVSA. Upon reception of the internal write enable signal WTE and the internal read enable signal RDE, the boosting circuit BSTC supplies the boosted potential BTV to the boosted potential node wiring WLUP. The boosted potential supply circuit array BSVSA includes a plurality of boosted potential supply circuits (first supply circuit) BSVS0 to BSVS7. Those boosted potential supply circuits BSVS0 to BSVS7 are coupled to the distal ends B of the word lines WL [0] to WL [7], respectively. Each of the boosted potential supply circuits BSVS0 to BSVS7 has the same circuit structure as that of the boosted potential supply circuit BSVS as shown in FIGS. 1A and 1B, and explanation thereof, thus will be omitted.

When seen from the position at which the row selection drive circuit RDECD and the control circuit CNTC are arranged, the boosting circuit BSTC, the boosted potential node wiring WLUP, and the boosted potential supply circuit array BSVSA are all located farther from the position at which the memory array MARY, the column selection circuits CSELC1, CSELC2, and the I/O control circuits IOC1, IOC2 are arranged. In other words, the memory array MARY, the column selection circuits CSELC1, CSELC2, and the I/O control circuits IOC1, IOC2 are disposed between the arrangement of the row selection drive circuit RDECD and the control circuit CNTC, and the arrangement of the boosting circuit BSTC, the boosted potential node wiring WLUP, and the boosted potential supply circuit array BSVSA.

Referring to FIG. 2, each of the inverter circuits INV1 exemplarily shown in the row selection drive circuit RDECD corresponds to the inverter circuit INV1 as shown in FIG. 1B, and regarded as the final-stage circuit of the word line driver. Each distal end A of the word lines WL [0] to WL [7] may be regarded as the part coupled to the output terminal of the inverter circuit INV1, or each part of the respective word lines WL [0] to WL [7] positioned between the row selection drive circuit RDECD and the memory array MARY. That is, the memory array MARY is disposed between the proximal ends A of the word lines WL [0] to WL [7] and the distal ends B of the word lines WL [0] to WL [7].

The structure of each circuit will be described referring to the drawings.

<Structure of Memory Cell MC>

FIG. 4 shows a structure of the memory cell MC as shown in FIG. 2. Each of the memory cells MC is of static type with the single port including 6 CMOS type transistors.

The memory cell MC includes P channel MOS transistors PM1, PM2, and N channel MOS transistors ND1, ND2, NTM1, NTM2. The source-drain paths of the P channel MOS transistors PM1, PM2 as load transistors are coupled between the line of the power supply voltage VDD and the first and the second storage nodes MB, MT. The gates of the transistors are coupled to the second and the first storage nodes MT, MB, respectively. The source-drain paths of the N channel MOS transistors ND1, ND2 as drive transistors are coupled between the first and the second storage nodes MB, MT, and the line of the ground potential VSS. The gates of the transistors are coupled to the second and the first storage nodes MT, MB, respectively. The source-drain paths of the N channel MOS transistors NTM1, NTM2 as transfer transistors are coupled between the storage nodes MB, MT, and the bit lines /BL, BL. The gates of the transistors are coupled to the word line WL.

The MOS transistors PM1, ND1 form a first inverter for giving an inverted signal of the signal of the second storage node MT to the first storage node MB. The MOS transistors PM2, ND2 form a second inverter for giving an inverted signal of the signal of the second storage node MB to the first storage node MT. Those two inverters are coupled between the first storage node MB and the second storage node MT in reversely parallel to each other, thus forming a latch circuit.

Upon setting of the level of the word line WL to a high selection level, the N channel MOS transistors NTM1 and NTM2 become conductive. If any one of the bit line pair BL and /BL, for example, the bit line BL is brought into the high level, and the other bit line, that is, /BL is brought into the low level in accordance with the write data signal, the MOS transistors PM2, ND1 become conductive, and the MOS transistors PM1, ND2 become non-conductive. This may latch each level of the storage nodes MB, MT. Upon setting of the word line WL to the low non-selection level, the N channel MOS transistors NTM1, NTM2 become non-conductive so that data signals are stored in the memory cell MC.

In the reading operation, the bit line pair BL, /BL is pre-charged to the high level, and then, the word line WL is set to the high selection level. Current flows to the line of the ground potential VSS from the bit line (in this case, /BL) via the N channel MOS transistors NTM1, NTM2, lowering the potential of the bit line /BL. Comparison of the potential between the bit lines BL and /BL by the sense amplifier SA allows reading of the storage data in the memory cell MC.

In the case that the memory cell MC stores the high level data "1", levels of the first and the second storage nodes MB, MT become "0" and "1", respectively. In the case that the memory cell MC stores the low level data "0", levels of the first and the second storage nodes MB, MT become "1" and "0", respectively.

<Control Circuit CNTC>

Figure 5:
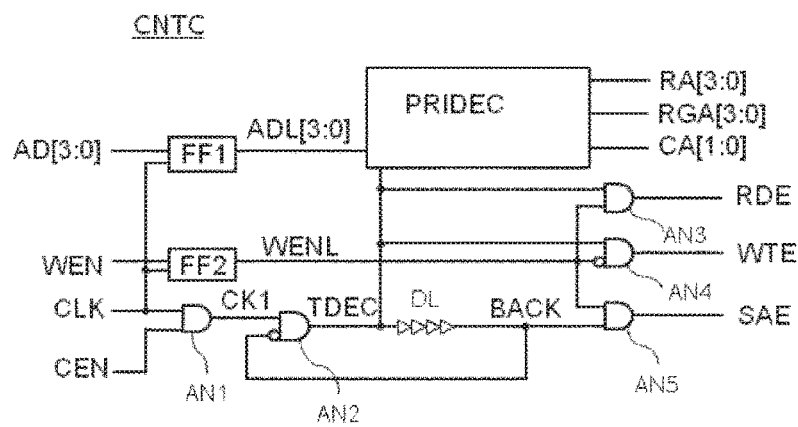
FIG. 5 is a view showing a structure of a control circuit CNTC as shown in FIG. 2.

FIG. 5 shows a structure of the control circuit CNTC as shown in FIG. 2.

The control circuit CNTC includes flip-flops FF1, FF2, AND circuits AN1 to AN5, a delay circuit DL, and a pre-decoder PRIDEC. The code WEN denotes the write enable signal as the write control signal for identifying a read command and a write command. The code CLK denotes the clock signal as a reference for reading and writing operations. The code CEN denotes the chip enable signal for controlling effectiveness/non-effectiveness of the clock signal.

The flip-flop FF1 captures the 4-bit address signal AD[3:0] based on the clock signal CLK for generating an internal address signal ADL [3:0]. The flip-flop FF2 captures the write enable signal WEN based on the clock signal CLK for generating the internal write enable signal WENL. The AND circuit AN1 generates an internal operation clock signal CK1 using the chip enable signal CEN and the clock signal CLK. Upon reception of the internal operation clock signal CK1 at one input terminal, the AND circuit AN2 generates a decode start-up signal TDEC as an activation trigger signal of the pre-decoder PRIDEC. Upon reception of an inverted signal of a timing adjustment signal BACK having the decode start-up signal TDEC delayed by a delay circuit DL at the other input terminal, the AND circuit AN2 varies the level of the decode start-up signal TDEC. The timing adjustment signal BACK adjusts the timing of the sense amplifier enable signal SAE. Upon reception of the decode start-up signal TDEC and the internal write enable signal WENL, the AND circuit AN3 generates the internal read enable signal RDE as the read pulse. Upon reception of the decode start-up signal TDEC and an inverted signal of the internal write enable signal WENL, the AND circuit AN4 generates the internal write enable signal WTE as the write pulse. Upon reception of the internal write enable signal WENL and the timing adjustment signal BACK, the AND circuit AN5 generates the sense amplifier enable signal SAE.

Upon reception of the decode start-up signal TDEC, the pre-decoder PRIDEC decodes the internal address signal ADL [3:0], and generates a RA [3:0], a 2-bit lower internal row address signal RGA [1:0], and a 2-bit internal column address signal CA [1:0].

<Pre-Decoder PRIDEC>

Figure 6:
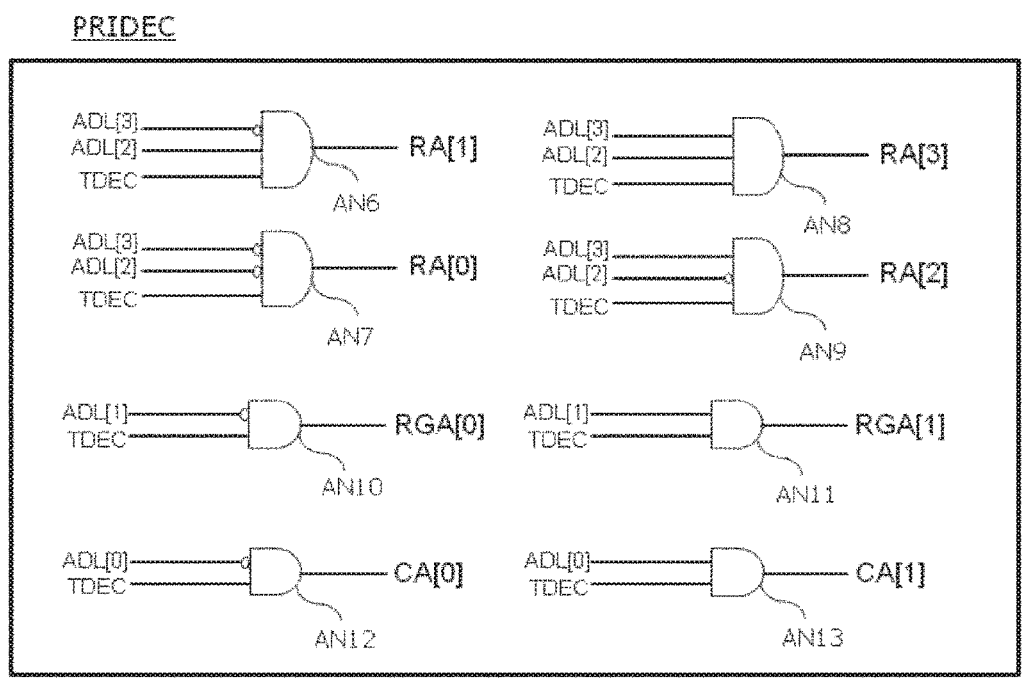
FIG. 6 is a view showing a structure of a pre-decoder PRIDEC as shown in FIG. 5.

FIG. 6 shows the structure of the pre-decoder PRIDEC.

The pre-decoder PRIDEC includes four AND circuits AN6 to AN9 for generating the 4-bit upper internal row address signals A [3], [2], [1], [0], two AND circuits AN10 to AN11 for generating the 2-bit lower internal row address signals RGA [1], [0], and AND circuits AN12 to AN13 for generating the 2-bit internal column address signals CA [1], [0].

Each of the AND circuits AN6 to AN9 is configured to receive the internal address signals ADL [3] and ADL [2], and the decode start-up signal TDEC for decoding the internal address signals ADL [3], ADL [2] by activating the decode start-up signal TDEC. The AND circuit AN6 is configured to receive an inverted signal of the internal address signal ADL [3]. The AND circuit AN7 is configured to receive inverted signals of the internal address signals ADL [3] and ADL [2]. The AND circuit AN9 is configured to receive an inverted signal of the internal address signal ADL [2].

Each of the AND circuits AN10 to AN11 is configured to receive the internal address signal ADL [1] and the decode start-up signal TDEC for decoding the internal address signal ADL [1] by activating the decode start-up signal TDEC. The AND circuit AN10 is configured to receive an inverted signal of the internal address signal ADL [1].

Each of the AND circuits AN12 to AN13 is configured to receive the internal address signal ADL [0] and the decode start-up signal TDEC for decoding the internal address signal ADL [0] by activating the decode start-up signal TDEC. The AND circuit AN12 is configured to receive an inverted signal of the internal address signal ADL [0].

<Row Selection Drive Circuit RDECD>

Figure 7:
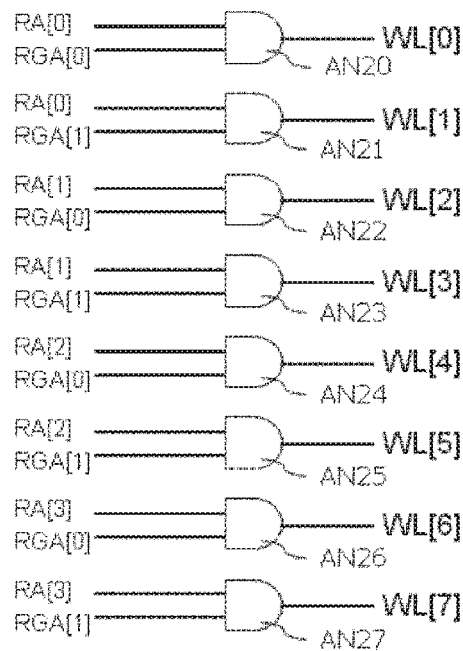
FIG. 7 is a view showing a structure of a row selection drive circuit RDECD as shown in FIG. 2.

FIG. 7 shows a structure of the row selection drive circuit RDECD as shown in FIG. 2.

The row selection drive circuit RDECD is configured to select one of the word lines WL [0], WL [1], WL [2], . . . , WL [7] by combining the 4-bit upper internal row address signals RA [3], [2], [1], [0] with the lower internal row address signals RGA [1], [0], and to include AND circuits AN20 to AN27. Each of the AND circuits AN20 to AN27 functions as a word line drive circuit (word line driver).

Upon reception of the internal row address signal RA [0] and the internal row address signal RGA [0], the AND circuit AN20 controls selection/non-selection of the word line WL [0]. Upon reception of the internal row address signal RA [0] and the internal row address signal RGA [1], the AND circuit AN21 controls selection/non-selection of the word line WL [1]. Upon reception of the internal row address signal RA [1] and the internal row address signal RGA [0], the AND circuit AN22 controls selection/non-selection of the word line WL [2]. Upon reception of the internal row address signal RA [1] and the internal row address signal RGA [1], the AND circuit AN23 controls selection/non-selection of the word line WL [3]. Upon reception of the internal row address signal RA [2] and the internal row address signal RGA [0], the AND circuit AN24 controls selection/non-selection of the word line WL [4].

Upon reception of the internal row address signal RA [2] and the internal row address signal RGA [1], the AND circuit AN25 controls selection/non-selection of the word line WL [5]. Upon reception of the internal row address signal RA [3] and the internal row address signal RGA [0], the AND circuit AN26 controls selection/non-selection of the word line WL [6]. Upon reception of the internal row address signal RA [3] and the internal row address signal RGA [1], the AND circuit AN27 controls selection/non-selection of the word line WL [7].

Figure 8:
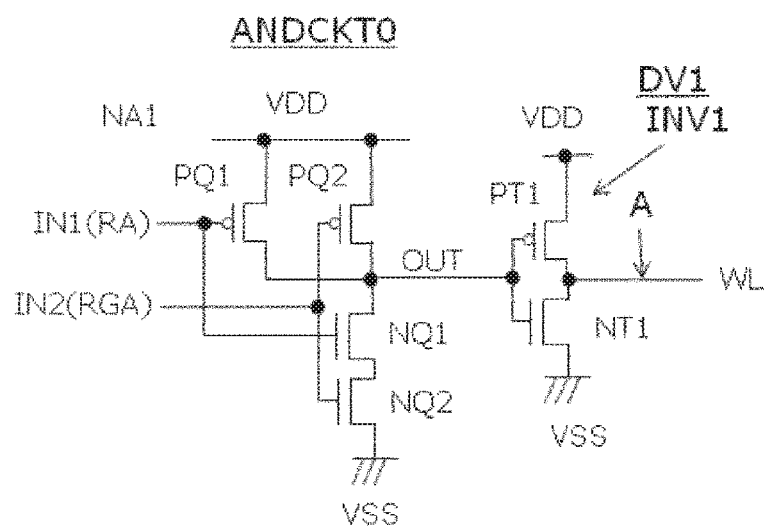
FIG. 8 is a view showing a structure of an AND circuit as shown in FIG. 7.

FIG. 8 shows a structure of the AND circuit as shown in FIG. 7.

An AND circuit ANCKT0 functions as the word line drive circuit (word line driver) represented by an exemplary structure of AND circuits AN20 to AN27.

The AND circuit ANDCKT0 includes a NAND circuit NA1 which receives the internal row address signals RA and the RGA, and the inverter circuit INV1 coupled to an output OUT of the NAND circuit NA1. The NA1 includes the P channel MOSFETs PQ1, PQ2, and the N channel MOSFETs NQ1, NQ2. Each of the P channel MOSFETs PQ1 and PQ2 includes a source coupled to the first power supply voltage VDD and a drain coupled to the output OUT. Each gate of the P channel MOSFETs PQ1 and PQ2 is coupled to the input IN1 for receiving the signal RA and the input IN2 for receiving the signal RGA, respectively. Each gate of the N channel MOSFETs NQ1 and NQ2 is coupled to the input IN1 for receiving the signal RA and the input IN2 for receiving the signal RGA, respectively. Each source-drain path of the N channel MOSFETs NQ1 and NQ2 is coupled in series between the output OUT and the second power supply voltage VSS.

Referring to FIG. 8, the output of the inverter circuit INV1 is coupled to the corresponding word line WL, forming the final-stage circuit of the word line driver circuit (word line driver). The inverter circuit INV1 corresponds to the inverter circuit INV1 as shown in FIG. 1B. The coupled part between the inverter circuit INV1 and the word line WL corresponds to the proximal end A of the word line WL.

<Column Selection Circuit CSELC1 and I/O Control Circuit IOC1>

FIG. 9 shows the column selection circuit and the I/O control circuit as shown in FIG. 2.

The column selection circuit CSELC1 includes a column selection switch YSW of the complementary bit line pair (/BL, BL), the pre-charge circuit and the equalize circuit of the complementary bit line (/BL, BL).

The pre-charge circuit is disposed for setting the complementary bit line pair /BL [0], BL [0] to the pre-charge potential like, for example, the power supply voltage VDD, and includes the P channel MOSFETs PQ11 and PQ12. Each source-drain path of the P channel MOSFETs PQ11, PQ12 is coupled between the power supply voltage VDD and the complementary bit line pair /BL [0], BL [0]. Each gate of the P channel MOSFETs PQ11, PQ12 is coupled to the column selection line CALN [0] for receiving the internal column address signal CA [0].

The equalize circuit disposed for equalizing the level of the complementary bit line pair /BL [0] and BL [0] includes the P channel MOSFET PQ13. The source-drain path of the P channel MOSFET PQ13 is coupled between the complementary bit line pair /BL [0] and BL [0], while having the gate coupled to the column selection line CALN [0] for receiving the internal column address signal CA [0].

The column selection switch circuit YSW is disposed for selectively coupling the complementary bit line pair /BL [0], BL [0] to a shared bit line pair CBR, CTR. The selection switch circuit YSW includes the N channel MOSFET NQ11, the P channel MOSFET PQ14, and the N channel MOSFET NQ12, the P channel MOSFET PQ15. Each source-drain path of the N channel MOSFET NQ11 and the P channel MOSFET PQ14 is disposed between the complementary bit line /BL [0] and the shared bit line CBR. Each source-drain path of the N channel MOSFET NQ12 and the P channel MOSFET PQ15 is disposed between the complementary bit line BL [0] and the shared bit line CTR. The N channel MOSFET NQ11, the P channel MOSFET PQ14, and the N channel MOSFET NQ12, the P channel MOSFET PQ15 are set as the CMOS switches, respectively. Each gate of the N channel MOSFET NQ11 and the N channel MOSFET NQ12 is coupled to the column selection line CALN [0] for receiving the internal column address signal CA [0]. Gates of the P channel MOSFETs PQ14 and PQ15 are coupled via the inverter circuit INV11 for receiving an inverted signal of the internal column address signal CA [0].

Likewise the column selection circuit CSELC1, the column selection circuit CSELC2 includes the column selection switch YSW for selectively coupling the complementary bit line pair /BL [1], BL [1], and the shared bit line pair CBR, CTR, and the pre-charge circuit and the equalize circuit of the complementary bit line pair (/BL [1], BL [1]). The column selection switch YSW, the pre-charge circuit, and the equalize circuit are controlled by the internal column address signal CA [1] supplied to the column selection line CALN [1]. The structure and the operation of the CSELC2 are similar to those of the column selection circuit CSELC1, and explanations thereof will be omitted because such explanations are readily understandable for those skilled in the art.

The I/O control circuit IOC1 is controlled by the internal write enable signal WTE as the internal write control signal, the internal read enable signal RDE as the internal read control signal, and the internal sense amplifier enable signal SAE as the internal sense amplifier activation signal. The I/O control circuit IOC1 includes the pre-charge circuit and the equalize circuit of the shared bit line pair CBR, CTR, the data write circuit, and a data output circuit.

The data write circuit is disposed for writing the write data supplied to the data input terminal D[0] to the selected memory cell. The data output circuit reads the data stored in the selected memory cell for outputting the data to the data output terminal Q[0].

The pre-charge circuits of the shared bit line pair CBR, CTR are formed as the P channel MOSFETs PQ21, PQ22. Each source-drain path of the P channel MOSFETs PQ21, PQ22 is coupled between the power supply voltage VDD and the shared bit line pair CBR, CTR. The equalize circuit of the shared bit line pair CBR, CTR is a P channel MOSFET PQ23, having the source-drain path coupled between the shared bit line pair CBR and CTR. Each gate of the P channel MOSFETs PQ21, PQ22, PQ23 is controlled by the internal write enable signal WTE, the internal read enable signal RDE, and an output signal IOEQN of an OR circuit OR10 for receiving an input of the internal sense amplifier enable signal SAE.

The data write circuit includes AND circuits AN30, AN31, and the write selection switch circuit WSW. The AND circuit AN30 receives the internal write enable signal WTE, and data of the data input terminal D[0] via the inverter circuit INV22. Meanwhile, the AND circuit AN31 receives the internal write enable signal WTE and data of the data input terminal D[0].

The write selection switch circuit WSW is disposed for selectively coupling between outputs of the AND circuits AN30, AN31, and the shared bit line pair CBR, CTR. The write selection switch circuit WSW includes an N channel MOSFET NQ21, a P channel MOSFET PQ24, an N channel MOSFET NQ22, and a P channel MOSFET PQ25. Each source-drain path of the N channel MOSFET NQ21 and the P channel MOSFET PQ24 is disposed between the shared bit line CBR and the output of the AND circuit AN30. Each source-drain path of the N channel MOSFET NQ22 and the P channel MOSFET PQ25 is disposed between the shared bit line CTR and the output of the AND circuit AN31. The N channel MOSFET NQ21, the P channel MOSFET PQ24, and the N channel MOSFET NQ22, the P channel MOSFET PQ25 are formed as the CMOS switches, respectively. Gates of the N channel MOSFET NQ21 and the N channel MOSFET NQ22 are coupled to receive the internal write enable signal WTE. Gates of the P channel MOSFET PQ24 and the P channel MOSFET PQ25 are coupled to receive the inverted signal of the internal write enable signal WTE via the inverter circuit INV21.

The data output circuit is disposed for reading data stored in the selected memory cell, and outputting the data to the data output terminal Q[0]. The data output circuit includes the sense amplifier SA coupled to the shared bit line pair CBR, CTR, the N channel MOSFET NQ33 for controlling operations of the sense amplifier SA, the latch circuit LT1, and a buffer circuit BF1 for supplying outputs of the latch circuit LT1 to the data output terminal Q[0]. The sense amplifier SA includes a first inverter circuit formed of the P channel MOSFET PQ31 and the N channel MOSFET NQ31, and a second inverter circuit formed of the P channel MOSFET PQ32 and the N channel MOSFET NQ32. The first inverter circuit and the second inverter circuit of the sense amplifier SA form the flip-flop circuit while having the respective inputs and outputs cross coupled.

Source-drain paths of the P channel MOSFET PQ31 and the N channel MOSFET NQ31 are coupled in series between the first power supply voltage VDD and the drain of the N channel MOSFET NQ33. Each gate of the P channel MOSFET PQ31 and the N channel MOSFET NQ31 is coupled to the shared bit line CTR. Each drain of the P channel MOSFET PQ31 and the N channel MOSFET NQ31 is coupled to the shared bit line CBR.

Likewise, the source-drain paths of the P channel MOSFET PQ32 and the N channel MOSFET NQ32 are coupled in series between the first power supply voltage VDD and the drain of the N channel MOSFET NQ33. Each gate of the P channel MOSFET PQ32 and the N channel MOSFET NQ32 is coupled to the shared bit line CBR, and each drain of the P channel MOSFET PQ32 and the N channel MOSFET NQ32 is coupled to the shared bit line CTR.

The gate of the N channel MOSFET NQ33 is coupled to receive the internal sense amplifier enable signal SAE. The N channel MOSFET NQ33 is brought into ON state by activating the internal sense amplifier enable signal SAE for supplying the operation current to the sense amplifier SA.

The latch circuit LT1 includes an input coupled to the shared bit line CTR, an output coupled to the buffer circuit BF1, and a control terminal which receives the inverted signal of the internal sense amplifier enable signal SAE. The latch circuit LT1 captures the signal level of the shared bit line CTR which has been amplified by the sense amplifier through deactivation of the internal sense amplifier enable signal SAE as the read data of the selected memory cell. The read data captured in the latch circuit LT1 are output to the data output terminal Q[0] via the buffer circuit BF1.

<Boosting Circuit BSTC>

Figure 10:
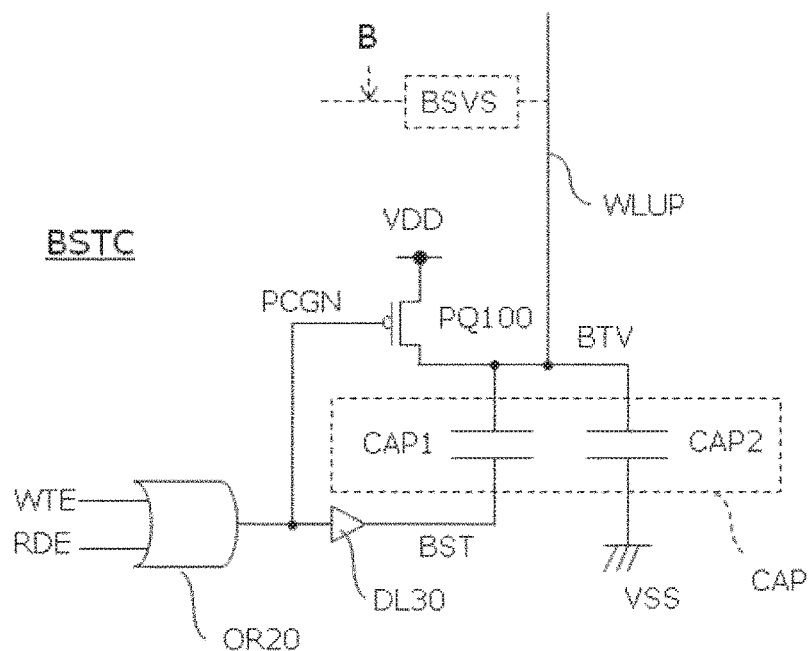
FIG. 10 is a view showing a structure of a boosting circuit as shown in FIGS. 1A, 1B, and 2.

FIG. 10 shows a structure of the boosting circuit as shown in FIGS. 1A, 1B, and 2.

As described referring to FIGS. 1A, 1B, the boosting circuit BSTC is the capacitance coupling type boosting circuit. The boosting circuit BSTC includes an OR circuit OR20 which receives inputs of the internal write enable signal WTE and the internal read enable signal RDE, a P channel MOSFET PQ100 which is controlled by the OR circuit OR20, the boot capacitive element CAP as a bootstrap capacitive element disposed for boosting, and the boosted potential node wiring VLUP to which the boosted potential BTV is supplied. The boosted potential supply circuits BSVS (BSVS0 to BSVS7) are coupled to the boosted potential node wiring WLUP. The internal write enable signal WTE, and the internal read enable signal RDE correspond to the second input signal IN2 as shown in FIGS. 1A and 1B. The boosted potential node wiring WLUP corresponds to the boosted potential node wiring VLUP as shown in FIGS. 1A and 1B.

The P channel MOSFET PQ100 includes the gate coupled to the output of the OR circuit OR20, the source coupled to the first power supply voltage VDD, and the drain coupled to the boosted potential node wiring WLUP. The boot capacitive element CAP includes a first capacitive element CAP1 and a second capacitive element CAP2. The first capacitive element CAP1 includes a first terminal coupled to the boosted potential node wiring WLUP, and a second terminal coupled to the output of the OR circuit OR20 via a delay element DL30. The second capacitive element CAP2 includes a first terminal coupled to the boosted potential node wiring WLUP, and a second terminal coupled to a reference potential (fixed potential) like the second power supply voltage VSS.

In the initial state, the OR circuit OR20 outputs a low-level pre-charge control signal PCGN like VSS to the gate of the P channel MOSFET PQ100 so that a boosting start-up signal is brought into the low level like VSS. Accordingly, the first capacitive element CAP1 and the second capacitive element CAP2 are coupled between the first power supply voltage VDD and the second power supply voltage VSS for charging or pre-charging.

The OR circuit OR20 varies the level of the pre-charge control signal PCGN from low to high like VDD, using the internal write enable signal WTE, or the internal read enable signal RDE as a trigger. As a result, the P channel MOSFET PQ100 is brought into OFF state. Then the level of the boosting start-up signal BST is varied from low to high like VDD so that the second terminal of the first capacitive element CAP1 is brought into the high level like VDD. This allows generation of the boosted potential BTV at the first terminal of the first capacitive element CAP1 so as to be supplied to the boosted potential node wiring WLUP.

The boosted potential BTV is boosted to the potential defined by the total value of the capacitance value of the first capacitive element CAP1, and the parasitic capacitance value of the boosted potential node wiring WLUP. In the case that the capacitance value of the parasitic capacitance of the boosted potential node wiring WLUP is relatively small, the second capacitive element CAP2 is provided for adjustment so as not to make the maximum potential of the boosted potential BTV too high. In other words, the second capacitive element CAP2 is capable of adjusting the potential level of the selection level of the word line (high level) so as to prevent data disruption by the static noise margin (SNM).

<Exemplary Operation of Storage Device MEM>

Figure 11:
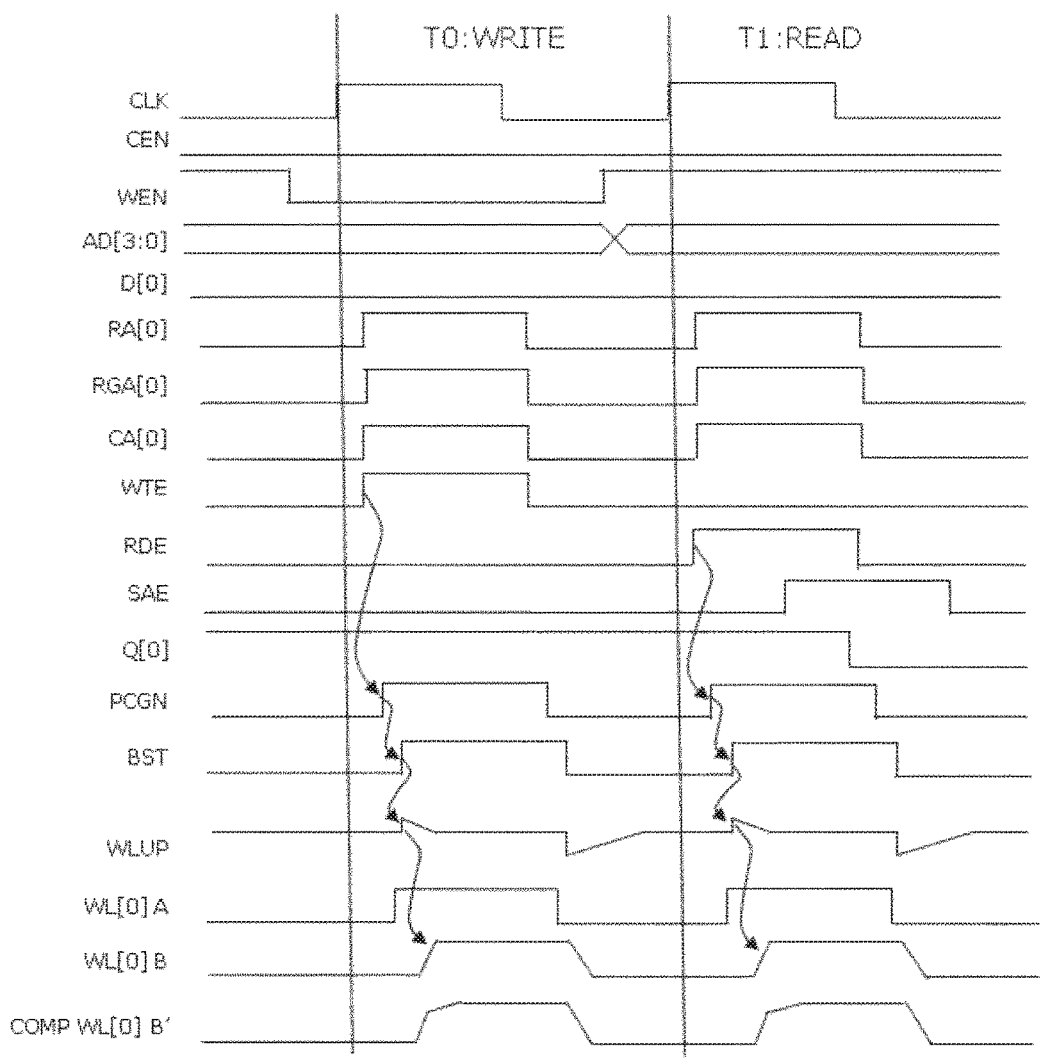
FIG. 11 is a waveform chart schematically showing an exemplary operation of the storage device as shown in FIG. 2.

FIG. 11 is a waveform chart representing exemplary operations of the storage device as shown in FIG. 2.

Referring to the example of FIG. 11, upon rise-up of the clock signal CLK, if the chip enable signal CEN is at the level 'L' (low level), and the write enable signal WEN is at the level 'L', the write cycle (T0) will be executed. If the CEN is at the level 'L', and the WEN is at the level 'H' (high level), the read cycle (T1) will be executed.

In the write cycle (T0), in response to rise-up of the clock signal CLK, the control circuit CNTC enables a level transition of the decode start-up signal TDEC from 'L' to 'H'. The control circuit CNTC outputs the internal write enable signal WTE at the level 'H', and the internal read enable signal RDE at the level 'L'. In response to the level transition of the TDEC to 'H', the pre-decoder PRIDEC generates the row selection signals (row address signals) RA [0], RGA [0], and the column selection signal (column address signals) CA [0]. The row selection drive circuit RDECD rises up the word line (WL [0]) in accordance with the RA [0], RGA [0]. In parallel with the above-described operation, a data input signal Din from an external terminal D[0] is input to the I/O control circuit IOC1. In response to the above-described WTE at the level 'H', the I/O control circuit IOC1 amplifies the input signal from the IOC1. The column selection circuit CSELC1 couples the output of the I/O control circuit IOC1 to the bit line pair (/BL [0], BL [0]) corresponding to the CA [0]. In this way, the Din information is written into the selected memory cell MC. Upon level transition of the decode start-up signal TDEC from 'H' to 'L', the word line WL [0] that has been raised is made fallen.

In the read cycle (T1), in response to rise-up of the clock signal CLK, the control circuit CNTC enables level transition of the decode start-up signal TDEC from 'L' to 'H'. The control circuit CNTC brings the internal write enable signal WTE into the level 'L', and the internal read enable signal RDE into the level 'H'. In response to the level transition of the TDEC enabled to 'H', the pre-decoder PRIDEC generates the row selection signals RA [0], RGA [0], and the column selection signal CA [0]. This example assumes that the row selection signals RA [0], RGA [0], and the word line WL [0] are selected, and the bit line pair (/BL [0], BL [0]) is selected by the row selection signal CA0. The row selection drive circuit RDECD rises up the word line WL [0] in accordance with the RA [0], RGA [0], which will be read to the bit line pair corresponding to the data stored in the respective memory cells coupled to the WL [0]. In this case, the read signal corresponding to the /BL [0], BL [0] is transmitted to the sense amplifier via the column selection circuit CSELC.

In parallel with the above-described operation, the transition of the sense amplifier enable signal SAE is enabled to the effective state (level 'H') in response to the level transition of the decode start-up signal TDEC to 'H'. The sense amplifier amplifies the read signals of the /BL [0], BL [0] transmitted via the column selection circuit CSELC as described above, using the SAE at the level 'H' as the trigger. The thus amplified signal is output to the external terminal Q[0] as a data output signal Dout via the I/O control circuit IOC1. The raised word line WL [0] is made fallen in response to the level transition of the decode start-up signal TDEC from 'H' to 'L'.

FIG. 11 shows waveforms of the word line WL [0] at the proximal end A (WL [0]A), the word line WL [0] at the distal end B (WL [0]B) according to the first example, and the word line WL [0] at a distal end B (COMP WL [0]13') according to a comparative example.

Upon rise-up of the word line (WL [0]), the boosting circuit BSTC and the boosted potential supply circuit BSVS execute the following process steps.

The boosting circuit BSTC enables the level transition of the PCGN from 'L' to 'H' in synchronization with the level transition of the internal write enable signal WTE from 'L' to 'H' in the write cycle T0, or in synchronization with the level transition of the internal write enable signal RDEL from 'L' to 'H' in the read cycle T1. After an elapse of a predetermined time, the boosting start-up signal BST enables the level transition from 'L' to 'H' to generate the boosted voltage BTV. The boosted voltage BTV is then supplied to the boosted potential node wiring WLUP. In the case that the potential at the distal end B of the word line WL [0] reaches the logical threshold level of the inverter circuit INV2, the boosted potential supply circuit BSVS0 enables the output level transition of the inverter circuit INV2 from 'H' to 'L' to bring the P channel MOSFET PT3 into ON state. Supply of the boosted voltage BTV of the boosted potential node wiring WLUP to the distal end B of the word line WL [0] is started so as to raise the potential at the distal end B of the word line WL [0] to the level 'H' like VDD.

The potential at the distal end B raised to the level 'H' by the boosted potential BTV will be kept at the level corresponding the power supply voltage VDD without reaching the boosted potential BTV. It is assumed that the signal level at the distal end B of the word line WL [0] reaches the VDD or higher. As the P channel MOSFET PT1 of the inverter circuit INV1 for driving the proximal end A of the word line WL [0] is in ON state as shown in FIG. 8, the potential in excess of the power supply voltage VDD will be absorbed into the first power supply voltage VDD as the low impedance power supply. In this way, the word line potential is not raised to the excessively high voltage, preventing disruption of the memory cell data by the static noise margin (SNM).

The boosted voltage BTV supplied to the boosted potential node wiring WLUP is generated by the capacitance coupling method (boot strap method) with no galvanic fixed potential. The thus generated BTV will not interfere with transition to the non-selection of the word line, that is, the level transition of the potential at the distal end B of the word line from 'H' to 'L'.

The level transition of the potential at the proximal end A of the word line WL [0] is enabled from 'L' to 'H' at relatively earlier stage. Meanwhile, the level transition of the potential at the distal end B of the word line WL [0] from 'L' to 'H' may be delayed later than the level transition of the potential at the proximal end A of the word line WL [0] from 'L' to 'H' because of the parasitic resistance and the load capacity of the word line WL [0]. However, the potential at the distal end B of the word line WL [0] is bought into the level 'H'.

The drawing shows the waveform at the distal end B of the word line WL [0] according to the comparative example (COMP WL [0]B') having no boosting circuit nor the boosted potential supply circuit. Referring to the COMP WL [0]B', the waveform unsharpness is observed in the level transition from 'L' to 'H' owing to the parasitic resistance and the load capacity of the word line WL [0]. As a result, the level transition to 'H' is delayed later than the case of the waveform of WL [0]B. The specific explanation will be made below referring to the drawings.

<Potential at distal end B of word line WL0>

FIG. 12 is a waveform chart explaining the potential at the distal end B of the word line WL [0]. FIG. 12 shows the potential at the distal end B of the word line WL [0], and the potential of the boosted potential node wiring WLUP.

Assuming that the level transition of the potential at the distal end A of the word line WL [0] is enabled from 'L' to 'H' at a time point t1, the potential at the distal end B of the word line WL [0] starts rising up from the level 'L' (VSS) at the time point t2. At the time point t3, the level transition of the boosting start-up signal BST is enabled from 'L' to 'H' to generate the boosted voltage BTV. The potential at the boosted voltage BTV is expressed as VDD+ΔV (Boost). When the potential at the distal end B of the word line WL [0] becomes VDD/2 at the time point t4, the level reaches the logical threshold of the inverter circuit INV2 of the boosted potential supply circuit BSVS. As a result, the output level transition of the inverter circuit INV2 is enabled from 'H' to 'L' so as to bring the P channel MOSFET PT3 of the boosted potential supply circuit BSVS into ON state. Supply of the boosted voltage BTV of the boosted potential node wiring WLUP is started to raise the potential level at the distal end B of the word line WL [0] to 'H' like VDD as indicated by the thick line Lb. At the time point t5, the charge electrically charged in boot capacitors CAP1, CAP2 of the boosting circuit BSTC is discharged to the distal end B of the word line WL [0]. As a result, the potential level at the distal end B of the word line WL [0] is kept at 'H' like VDD.

The dotted line La of FIG. 12 indicates the potential transition at the distal end B of the word line WL [0] (COMP WL [0]B') according to the comparative example which does not include the boosting circuit BSTC nor the boosted potential supply circuit BSVS.

<Example of Setting Capacitive Elements CAP1 and CAP2>

FIG. 13 shows an exemplary setting of the capacitive elements CAP1 and CAP2 as shown in FIG. 10.

FIG. 13 shows an exemplary memory array structure, and values of the first capacitive element CAP1 and the second capacitive element CAP2. The memory array height (H) is substantially the same as the wiring length of the word line, or proportional to the number of the data line pairs. The memory array width (W) is substantially the same as the wiring length of the data line, the wiring length of the boosted potential node wiring WLUP, or proportional to the number of the word lines.

The array 1 including N word lines, and M data line pairs has its height H set to H1, and its width W set to W1. In this case, each value of the first capacitive element CAP1 and the second capacitive element CAP2 is set to, for example, C11 and C21, respectively.

The array 2 including N word lines, and I data line pairs, which is less than the M data line pairs (I<M) has its height H set to H1, and its width set to W2 smaller than the W1 (W2<W1). In this case, each value of the first capacitive element CAP1 and the second capacitive element CAP2 is set to C12 smaller than C11(<C11), and C21, respectively.

The array 3 including K word lines less than N word lines (K<N), and M data line pairs has its height H set to H2 lower than H1(<H1), and its width W set to W1. In this case, each value of the first capacitive element CAP1 and the second capacitive element CAP2 is set to C11, and C22 larger than C21(>C21), respectively.

In the case of the array having K word lines less than N word lines (K<N), and I data line pairs less than M data liens (I<M), which is not shown in FIG. 13, the height H and the width W of the memory array will be set to H2 lower than H1(<H1), and set to W2 smaller than W1 (W2<W1). In this case, each value of the first capacitive element CAP1, and the second capacitive element CAP2 will be set to C12 smaller than C11(<C11), and set to C22 larger than C21 (>C21).

In other words, values of the first capacitive element CAP1 and the second capacitive element CAP2 are determined in accordance with the relation between the height (H) and the width (W) of the memory array.

A plurality of storage devices MEM are disposed in the semiconductor device 1. If the memory array of the memory cells has different values of both height H and width W among those storage devices MEM, the first and the second capacitive elements CAP1 and CAP2 will take different values.

<Schematic Layout of Storage Device>

Figure 14:
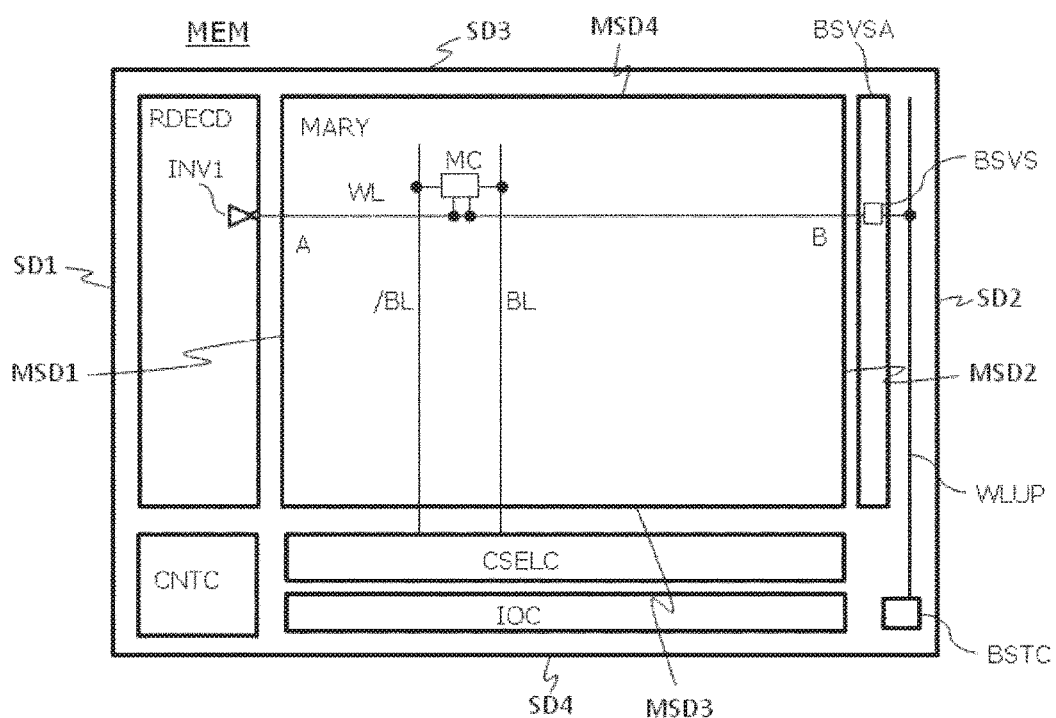
FIG. 14 is a view schematically showing a layout of the storage device as shown in FIG. 2.

FIG. 14 schematically shows the layout of the storage device as shown in FIG. 2.

FIG. 14 exemplarily shows the word line driver (INV1), the memory cell (MC), the word line (WL), the complementary bit line pair (/BL, BL), and the boosted potential supply circuit (BSVS). Actually, the storage device is structured as shown in FIG. 2.

The storage device M as a memory macro IP with substantially quadrangular shape is formed over the semiconductor chip. Referring to the drawing, the row selection drive circuit RDECD is disposed at the upper left side of the quadrangular memory macro IP. The control circuit CNTC is disposed below the row selection drive circuit RDECD. The substantially quadrangular memory array MARY, the boosted potential supply circuit array BSVSA, and the boosted potential node wiring WLUP are laterally disposed in sequence to the right of the row selection drive circuit RDECD. The column selection circuits CSELC (CSELC1, CSELC2), and the I/O control circuit IOC (IOC1, IOC2), and the boosting circuit BST are disposed in sequence to the right of the control circuit CNTC.

In other words, the storage device MEM has a quadrangular outer shape including a first side SD1, a second side SD2 oppositely facing the SD1, a third side SD3 extending between the first side SD1 and the second side SD2, and a fourth side SD4 oppositely facing the third side SD3. The row selection drive circuit RDECD and the control circuit CNTC are arranged along the first side SD1. The boosted potential supply circuit array BSVSA, the boosted potential node wiring WLUP, and the boosting circuit BSTC are arranged along the second side SD2. The memory array MARY is disposed between the row selection drive circuit RDECD and the boosted potential supply circuit array BSVSA. The column selection circuit CSELC and the I/O control circuit IOC are arranged between the memory array MARY and the fourth side SD4. The column selection circuit CSELC is disposed between the memory array MARY and the I/O control circuit IOC. The boosting circuit BSTC is disposed between the I/O control circuit IOC and the second side SD2. The boosted potential node wiring WLUP is disposed between the boosted potential supply circuit array BSVSA and the second side SD2.

The memory array MARY has a substantially quadrangular shape including a first side MSD1, a second side MSD2 oppositely facing the first side MSD1, a third side MSD3 extending between the first side MSD1 and the second side MSD2, and a fourth side MSD4 oppositely facing the third side MSD3. In reference to the memory array MARY, the row selection drive circuit RDECD is arranged along the first side MSD1. The boosted potential supply circuit array BSVSA is arranged along the second side MSD2. The column selection circuit CSELC is disposed along the third side MSD3. The I/O control circuit IOC is arranged in line with the column selection circuit CSELC disposed between the third side MSD3 and the I/O control circuit IOC. The boosted potential node wiring WLUP is arranged in line with the boosted potential supply circuit array BSVSA so that the boosted potential supply circuit array BSVSA is positioned between the second side MSD2 and the boosted potential node wiring WLUP. The control circuit CNTC is arranged below the row selection drive circuit RDECD to the left of the I/O control circuit IOC and the column selection circuit CSELC. The boosting circuit BSTC is arranged to the right of the I/O control circuit IOC so that the I/O control circuit IOC is disposed between the control circuit CNTC and the boosting circuit BSTC.

The boosted potential supply circuit array BSVSA, the boosted potential node wiring WLUP, and the boosting circuit BSTC are arranged to the right of the substantially quadrangular shaped memory macro IP on the drawing. That is, they are collectively arranged at one end side (distal end B) of the word line opposite the other end side (proximal end A) of the word line (WL) to which the word line driver (INV1) is coupled. This makes it possible to immediately raise the potential at the other end part (distal end B) of the word line, and to lessen the increase in the area to be relatively small.

Second Example

FIG. 15 is a block diagram of the storage device MEM according to a second example.

FIG. 15 shows another example of the storage device MEM as shown in FIG. 2. The explanation will be made with respect only to the different parts from those shown in FIG. 2. The storage device MEM as shown in FIG. 15 is formed by adding boosted potential supply circuits (second supply circuits) BSVS10, BSVS11, a boosted potential node wiring CAUP, and a boosting circuit (second boosting circuit) BSTC2 to the storage device MEM as shown in FIG. 2. The boosted potential supply circuits BSVS10, BSVS11, the boosted potential node wiring CAUP, and a boosting circuit BSTC2 are provided for raising the potential at distal ends BB of the column selection lines CALN [0], CALN [1] to which the internal column address signals CA [0], CA [1] are supplied. The proximal ends of the column selection lines CALN [0], CALN [1] will be designated as AA. The column selection lines CALN [0], CALN [1] correspond to the metal signal wiring LN as shown in FIG. 1B.

Referring to FIG. 15, the boosted potential supply circuit BSVS10 is coupled between the distal end BB of the column selection line CALN [0] and the boosted potential node wiring CAUP. Likewise, the boosted potential supply circuit BSVS11 is coupled between the distal end BB of the column selection line CALN [1] and the boosted potential node wiring CAUP. The boosted potential node wiring CAUP is coupled to the boosting circuit BSTC2, and receives the boosted voltage therefrom.

Each of the boosted potential supply circuits BSVS10, BSVS11 has the same structure as that of the boosted potential supply circuit BSVS as shown in FIG. 1B, and includes the inverter circuit INV2 and the P channel MOSFET PT3. The boosting circuit BSTC2 may have the same structure as that of the boosting circuit BSTC as shown in FIG. 10, and includes OR20, DL30, PQ31, CAP1, CAP2 for receiving the internal write enable signal WTE and the internal read enable signal RDE.

The control circuit CNTC as shown in FIG. 15 includes the pre-decoder PRIDEC as shown in FIG. 6. The internal column address signals CA [0], CA [1] are generated by the AND circuits AN12 and AN13. Structures of the AND circuits AN12 and AN13 will be described. Coupled parts between outputs of the AND circuits AN12, AN13 and the column selection lines CALN [0], CALN [1], or the periphery of the coupled parts are regarded as proximal ends AA of the column selection lines CALN [0], CALN [1].

FIG. 16A shows the structure of the AND circuit AN12 as shown in FIG. 6. The AND circuit AN12 functions as the drive circuit (column line driver) for the column selection line CALN [0].

The AND circuit AN12 includes an inverter circuit INV40 which receives the signal ADL[0], a NAND circuit NA40 which receives an output OUT40 of the inverter circuit INV40 and the signal TDEC, and the inverter circuit INV1 coupled to an output OUT41 of the NAND circuit NA40.

The INV40 includes a P channel MOSFET PQ41 and an N channel MOSFET NQ41. Each gate of the P channel MOSFET PQ41 and at the N channel MOSFET N141 is coupled to the input IN1 which receives the ADL[0]. The source-drain path is coupled in series between the first power supply voltage VDD and the second power supply voltage VSS.

The NAND circuit NA40 includes P channel MOSFETs PQ42, PQ43, and N channel MOSFETs NQ42, NQ43. Each of the P channel MOSFETs PQ42 and PQ43 includes a source coupled to the first power supply voltage VDD, and a drain coupled to the output OUT 41. Gates of the P channel MOSFET PQ42, PQ43 are coupled to the output OUT40 of the inverter circuit INV40, and the input IN2 which receives the TDEC, respectively. Gates of the N channel MOSFETs NQ42, NQ43 are coupled to the output OUT40 of the inverter circuit INV40, and the input IN2 which receives the TDEC, respectively. The source-drain paths for the N channel MOSFETs NQ42, NQ43 are coupled in series between the output OUT41 and the second power supply voltage VSS.

Referring to FIG. 16A, the output of the inverter circuit INV1 is coupled to the column selection line CALN [0], and forms the final stage of the drive circuit (column line driver) of the column selection line CALN [0]. The inverter circuit INV1 corresponds to the inverter circuit INV1 as shown in FIG. 1B. The coupled part between the output of the inverter circuit INV1 and the column selection line CALN [0] corresponds to the proximal end AA of the column selection line CALN [0].

FIG. 16B shows a structure of the AND circuit AN13 as shown in FIG. 6.

The AND circuit AN13 functions as the column selection line or the drive circuit (column line driver) of the column selection line CALN [1].

The AND circuit AN13 includes a NAND circuit NA50 which receives the ADL [0] and the TDEC, and the inverter circuit INV1 coupled to an output OUT50 of the NAND circuit NA50. The NAND circuit NA50 includes P channel MOSFETs PQ51, PQ52, and N channel MOSFETs NQ51, NQ52. Each of the P channel MOSFETs PQ51, PQ52 includes a source coupled to the first power supply voltage VDD, and a drain coupled to the output OUT50. Gates of the P channel MOSFETs PQ51, PQ52 are coupled to the input IN1 which receives the ADL [0], and the input IN2 which receives TDEC, respectively. Gates of the N channel MOSFETs NQ51, NQ52 are coupled to the input IN1 which receives the ADL [0], and the input IN2 which receives the TDEC, respectively. The source-drain paths of the N channel MOSFETs NQ51, NQ52 are coupled in series between the output OUT50 and the second power supply voltage VSS.

Referring to FIG. 16B, the output of the inverter circuit INV1 is coupled to the column selection line CALN [1] for forming the final stage of the drive circuit (column line driver) of the column selection line CALN [1]. The inverter circuit INV1 corresponds to the inverter circuit INV1 as shown in FIG. 1B. The coupled part between the output of the inverter circuit INV1 and the column selection line CALN [1] corresponds to the proximal end AA of the column selection line CALN [1].

As described referring to FIG. 9, the column selection lines CALN [0], CALN [1] are coupled to the column selection MOSFETs (NQ11, NQ12, PQ14, PQ15 as shown in FIG. 9) of the row selection circuits CSELC1, CSELC2, the pre-charge circuit and the equalize circuit (PQ11, PQ12, PQ13, INV11 as shown in FIG. 9). If the number of the MATs disposed in the memory array MARY is increased, and the number of the complementary data line pairs to be disposed in the MAT is increased, the column selection lines CALN [0], CALN [1] are wired with relatively long distance. Accordingly, the parasitic resistance of the wiring for the column selection lines CALN [0], CALN [1] will be enlarged.

FIG. 15 shows the boosted potential supply circuits BSVS10, BSVS11, the boosted potential node wiring CAUP, and the boosting circuit BSTC2 added to the boosted potential supply circuits BSVS0 to BSVS7, the boosted potential node wiring WLUP, and the boosting circuit BSTC for the word lines WL. The resultant structure provides the effects derived from the first example as described above as well as those described below.

The high potential at the level H at the distal end BB of the column selection lines CALN [0], CALN [1] as a result of the boosted potential BTV generated by the boosting circuit BSTC2 is kept at the potential level of the power supply voltage VDD without reaching the boosted potential BTV. Assuming that the signal level at the distal end BB of the column selection lines CALN [0], CALN [1] becomes equal to or higher than VDD, the P channel MOSFET PT1 of the inverter circuit INV1 as shown in FIGS. 16A, 16B for driving the proximal end AA of the column selection lines CALN [0], CALN [1] is in ON state. Consequently, the potential equal to or higher than the power supply voltage VDD will be absorbed into the first power supply voltage VDD as the low-impedance power supply. The level transition at the distal end BB of the column selection lines CALN [0], CALN [1] from 'L' to 'H' is delayed later than the level transition at the proximal end AA of the column selection lines CALN [0], CALN [1] from 'L' to 'H' owing to the parasitic resistance and load capacity of the column selection lines CALN [0], CALN [1]. However, at the distal end BB of the column selection lines CALN [0], CALN [1], the level is brought into 'H' at high speeds.

The transition of the column selection lines CALN [0], CALN [1] to the selection level is enabled at high speeds so as to accelerate operations of the column selection MOSFETs (NQ11, NQ12, PQ14, PQ15 as shown in FIG. 9) of the row selection circuits CSELC1, CSELC2, the pre-charge circuit, and the equalize circuit (PQ11, PQ12, PQ13, INV11 as shown in FIG. 9).

Selection of the memory cell in the storage device MEM is accelerated by accelerating the selection operations of the word line, and the column selection MOSFET.

Third Example

Figure 17:
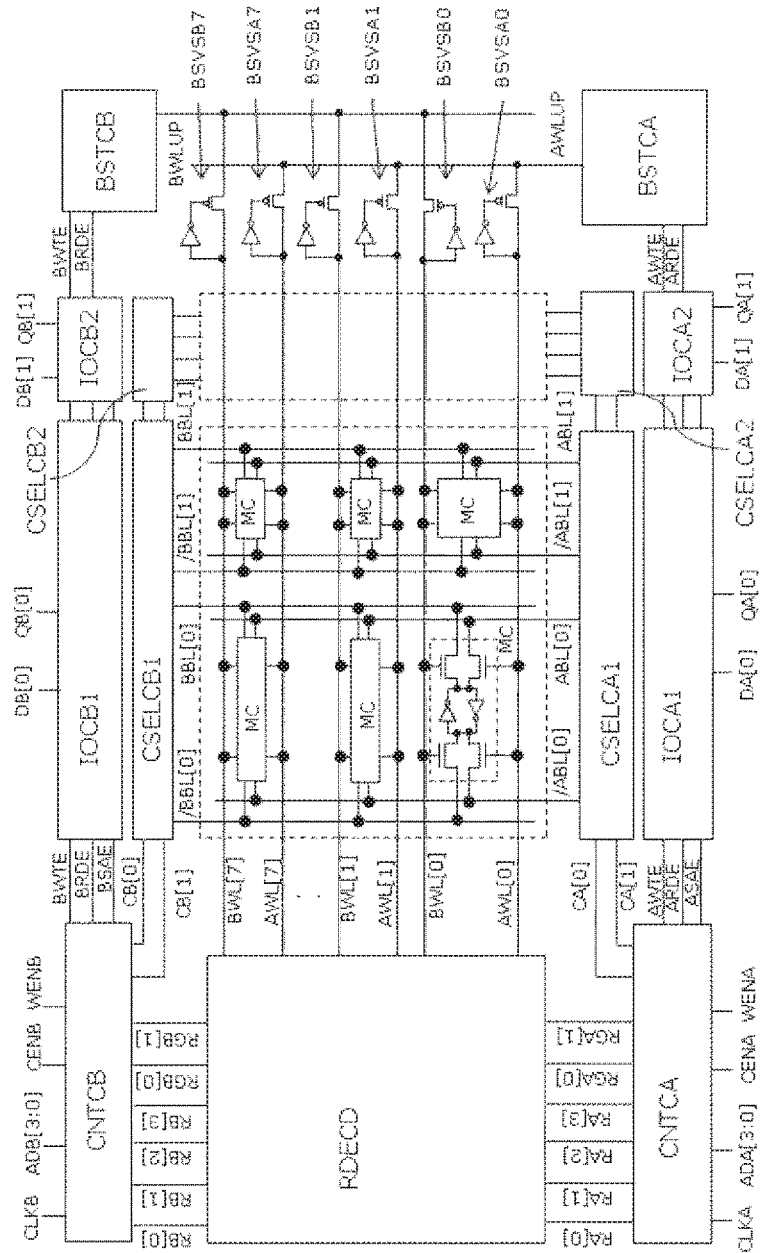
FIG. 17 is a block diagram of a storage device according to a third example.

FIG. 17 is a block diagram of the storage device according to a third example.

Figure 18:
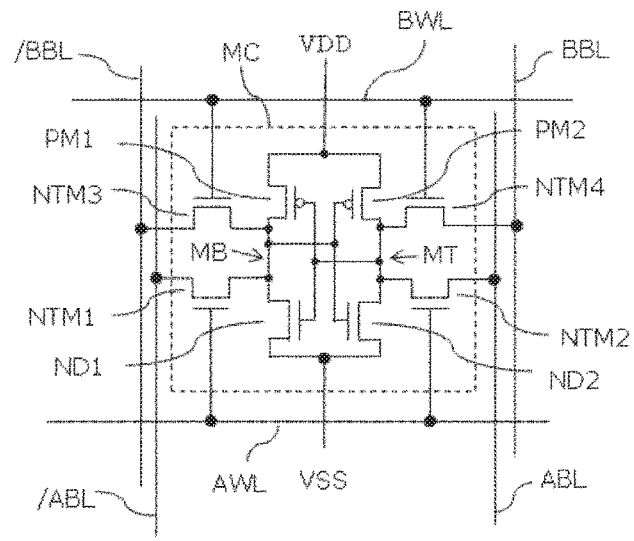
FIG. 18 is a view showing a structure of a dual port type memory cell.

FIG. 17 is a schematic block diagram of the storage device (SRAM) using a dual port type memory cell (2-port type memory cell) as the memory cell MC. FIG. 18 shows a structure of the dual port type memory cell. The dual port type memory cell will be described by designating the first port as a port A, and the second port as a port B.

Explanation will be made referring first to FIG. 18, and then to FIG. 17.
<Dual Port Type Memory Cell>

FIG. 18 shows a structure of the dual port type memory cell 8T DP-SRAM cell including 8 transistors. As shown in FIG. 18, the 8T DP-SRAM cell includes N channel MOS (NMOS) transistors ND1, ND2, NTM1-MTM4, and P channel MOS (PMOS) transistors PM1, PM2.

The NMOS transistors ND1, ND2, and the PMOS transistors PM1, PM2 form two cross-coupled inverters. The drains of the NMOS transistors ND1, ND2 are coupled to the storage nodes MB, MT, respectively, and the sources are grounded in common. The drains of the PMOS transistors PM1, PM2 are coupled to the storage nodes MB, MT, respectively. The sources are coupled to the power supply VDD in common. Each gate of the NMOS transistor ND1, and the PMOS transistor PM1 is coupled to the storage node MT in common. Each gate of the NMOS transistor MN2 and the PMOS transistor PM2 is coupled to the storage node MB in common.

The NMOS transistors NTM1, NTM2 are selection transistors disposed between the storage nodes MB, MT and the bit line pair /ABL, ABL at the port A side, respectively. The NMOS transistor NTM1 is coupled between the storage node MB and the bit line /ABL at the port A side. The NMOS transistor NTM2 is coupled between the storage node MT and the bit line ABL at the port A side. The gates of the NMOS transistors NTM1, NTM2 are coupled to the word line AWL at the port A side in common.

NMOS transistors NTM3, NTM4 are selection transistors disposed between the storage nodes MB, MT, and the bit line pair /BBL, BBL at the port B side, respectively. The NMOS transistor NTM3 is coupled between the storage node MB and the bit line /BBL at the port B side. The NMOS transistor NTM4 is coupled between the storage node MT and the bit line BBL at the port B side. The gates of the NMOS transistors NTMT3, NTM4 are coupled to the port B side word line BWL in common.
<Structure of Storage Device using Dual Port Type Memory Cell>

As FIG. 17 shows, at the port A side, there are provided a port A control circuit CNTCA, port A column selection circuits CSELCA1, CSELCA2, port A I/O circuits IOCA1, IOCA2, a port A boosting circuit BSTCA, and a port A boosted potential node wiring AWLUP. The port A control circuit CNTCA receives a port A clock signal CLKA, a port A address signal RA [3:0], a port A chip selection signal (chip enable signal) CENA, and a port A write enable signal WENA. The port A control circuit CNTCA outputs port A row address signals RA [0], RA [1], RA [3], RGA [0], RGA [1] to the row selection drive circuit RDECD, and port A column address signals CA [0], CA [1] to the port A column selection circuits CSELCA1, CSELCA2. The port A control circuit CNTCA outputs a port A read control signal ARDE, a port A write control signal (internal write enable signal) AWTE, and a port A sense amplifier activation signal (sense amplifier enable signal) ASAE to the port A I/O circuits IOCA1, ICA2, and the port A boosting circuit BSTCA.

The port A boosting circuit BSTCA is coupled to the port A boosted potential node wiring AWLUP, and supplies the boosted potential to the port A boosted potential node wiring AWLUP. The boosted potential supply circuits BSVSA0 to BSVSA7 are disposed between the port A boosted potential node wiring AWLUP and the port A word lines AWL [0] to AWL [7].

At the port B side, there are provided a port B control circuit CNTCB, port B column selection circuits CSELCB1, CSELCB2, port B I/O circuits IOCB1, IOCB2, a port B boosting circuit BSTCB, and a port B boosted potential node wiring BWLUP. The port B control circuit CNTCB receives a port B clock signal CLKB, a port B address signal RB[3:0], a port B chip selection signal (chip enable signal) CENB, and a port B write enable signal WENB. The port B control circuit CNTCB outputs port B row address signals RB[0], RB[1], RB[3], RGB[0], RGB[1] to the row selection drive circuit RDECD, and port B column address signals CB[0], CB[1] to the port B column selection circuits CSELCB1, CSELCB2. The port B control circuit CNTCB outputs a port B read control signal BRDE, a port B write control signal (internal write enable signal) BWTE, and a port B sense amplifier activation signal (sense amplifier enable signal) BSAE to the port B I/O circuits IOCB1, IOCB2, and the port B boosting circuit BSTCB.

The port B boosting circuit BSTCB is coupled to the port B boosted potential node wiring BWLUP, and supplies the boosted potential BTV to the port B boosted potential node wiring BWLUP. Boosted potential supply circuits BSVSB0 to BSVSB7 are disposed between the port B boosted potential node wiring BWLUP and the port B word lines BWL [0] to BWL [7].

The respective structures and operations of the boosting circuits BSTCA, BSTCB, the boosted potential supply circuits BSVSA0 to BSVSA7, the BSVSB0 to BSVSA7 are the same as those of the boosting circuit BSTC, the boosted potential supply circuits BSVS as described in the second embodiment, and the boosting circuit BSTC, and the boosted potential supply circuits BSVS0 to BSVS7 as described in the first example besides the boosted voltage generation timing.

<Structure of Row Selection Drive Circuit RDECD Shown in FIG. 17>

Figure 19:
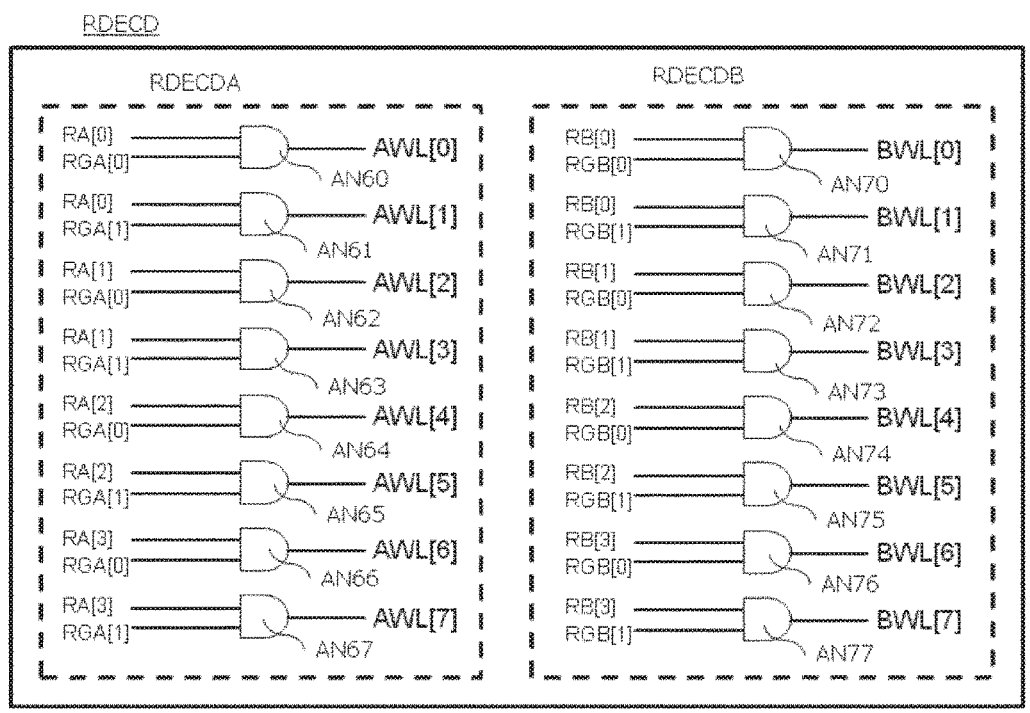
FIG. 19 is a view showing a structure of a row selection drive circuit RDECD as shown in FIG. 17.

FIG. 19 shows a structure of the row selection drive circuit RDECD as shown in FIG. 17.

The row selection drive circuit RDECD includes a port A row selection drive circuit RDECDA and a port B row selection drive circuit RDECDB.

The port A row selection drive circuit RDECDA is configured to select the single word line from the port A side word lines AWL [0], AWL [1], AWL [2], . . . , AWL [7] through combination of the 4-bit upper internal row address signals RA [3], [2], [1], [0] with the 2-bit lower internal row address signals RGA [1], [0], and to include AND circuits AN60 to AN67. Each of the AND circuits AN60 to AN67 functions as the word line drive circuit (word line driver).

The AND circuit AN60 receives the internal row address signal RA [0] and the internal row address signal RGA [0] for controlling selection/non-selection of the word line AWL [0]. The AND circuit AN61 receives the internal row address signal RA [0] and the internal row address signal RGA [1] for controlling selection/non-selection of the word line AWL [1]. The AND circuit AN62 receives the internal row address signal RA [1] and the internal row address signal RGA [0] for controlling selection/non-selection of the word line AWL [2]. The AND circuit AN63 receives the internal row address signal RA [1] and the internal row address signal RGA [1] for controlling selection/non-selection of the word line AWL [3]. The AND circuit AN64 receives the internal row address signal RA [2] and the internal row address signal RGA [0] for controlling selection/non-selection of the word line AWL [4]. The AND circuit AN65 receives the internal row address signal RA [2] and the internal row address signal RGA [1] for controlling selection/non-selection of the word line AWL [5]. The AND circuit AN66 receives the internal row address signal RA [3] and the internal row address signal RGA [0] for controlling selection/non-selection of the word line AWL [6]. The AND circuit AN67 receives the internal row address signal RA [3] and the internal row address signal RGA [1] for controlling selection/non-selection of the word line AWL [7].

The port B row selection circuit RDECDB is configured to select the single word line from the port B side word lines BWL [0], BWL [1], BWL [2], . . . , BWL [7] through combination of the 4-bit upper internal row address signals RB[3], [2], [1], [0] with the 2-bit lower internal row address signals RGB[1], [0], and to include AND circuits AN70 to AN77. Each of the AND circuits AN70 to AN77 functions as the word line drive circuit (word line driver).

The AND circuit AN70 receives the internal row address signal RB [0] and the internal row address signal RGB [0] for controlling selection/non-selection of the word line BWL [0]. The AND circuit AN71 receives the internal row address signal RB [0] and the internal row address signal RGB [1] for controlling selection/non-selection of the word line BW1]. The AND circuit AN72 receives the internal row address signal RB [1] and the internal row address signal RGB[0] for controlling selection/non-selection of the word line BWL [2]. The AND circuit AN73 receives the internal row address signal RB[1] and the internal row address signal RGB [1] for controlling selection/non-selection of the word line BWL [3]. The AND circuit AN74 receives the internal row address signal RB[2] and the internal row address signal RGB [0] for controlling selection/non-selection of the word line BWL [4]. The AND circuit AN75 receives the internal row address signal RB [2] and the internal row address signal RGB [1] for controlling selection/non-selection of the word line BWL [5]. The AND circuit AN76 receives the internal row address signal RB [3] and the internal row address signal RGB [0] for controlling selection/non-selection of the word line BWL [6]. The AND circuit AN77 receives the internal row address signal RB [3] and the internal row address signal RGB[1] for controlling selection/non-selection of the word line BWL [7]. The specific structures of the respective AND circuits AN60-AN67, and AN70-AN77 are the same as those shown in FIG. 8.

<Schematic Exemplary Operation of Storage Device MEM>

Figure 20:
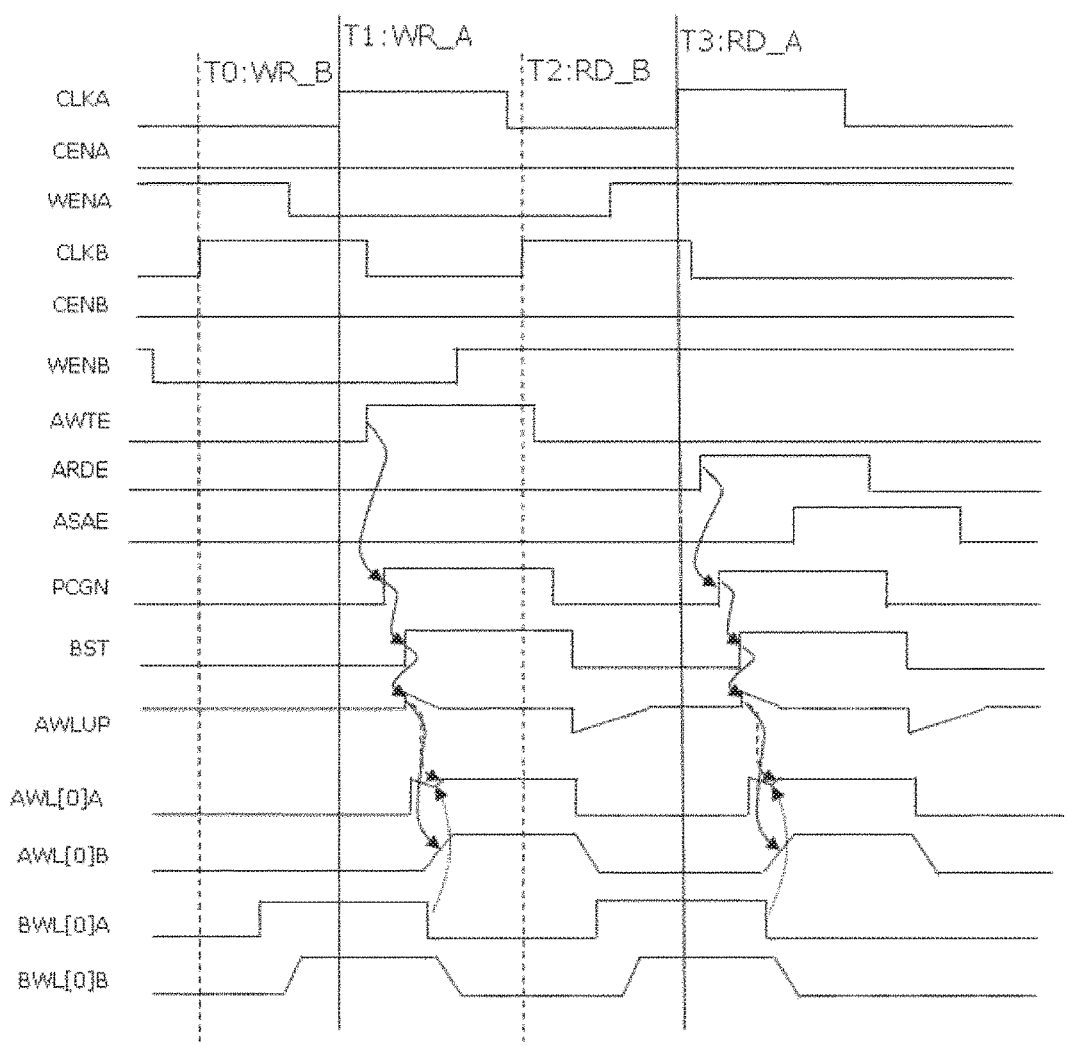
FIG. 20 is a waveform chart schematically showing an exemplary operation of the storage device as shown in FIG. 17.

FIG. 20 is a waveform chart schematically representing exemplary operations of the storage device as shown in FIG. 17.

Referring to the example shown in FIG. 20, if the chip enable signal CENB is at the level 'L' (low level), and the write enable signal WENB is at the level 'L' upon rise-up of the clock signal CLKB, the port B side writing (write) cycle T0 is executed. If the CENB is at the level 'L', and the WENB is at the level 'H' (high level), the port B side reading (read) cycle T2 is executed.

Likewise, if the chip enable signal CENA is at the level 'L', and the write enable signal WENA is at the level 'L' upon rise-up of the clock signal CLKA, the port A side writing (write) cycle T1 is executed. If the CENA is at the level 'L', and the WENA is at the level 'H', the port A side reading (read) cycle T3 is executed.

According to the example, the port B side word line WLB0 is selected in the cycles T0 and T2. The port A side word line WLA0 is selected in the cycles T1 and T3. The memory cell selected in the cycles T0 and T2 is different from the memory cell selected in the cycles T1 and T3.

In the port B side writing (write) cycle T0 (T0:WR_B), in response to rise-up of the clock signal CLKB, the control circuit CNTCB enables the level transition of a decode start-up signal BTDEC from 'L' to 'H'. The control circuit CNTCB brings the internal write enable signal BWTE into the level 'H', and the internal read enable signal BRDE into the level 'L'. Upon level transition of the BTDEC to 'H', the pre-decoder PRIDEC generates the row selection signals RB [0], RGB [0], and a column selection signal CB [0] for rising up the word line (BWL [0]) corresponding to the RB [0], RGB [0]. In parallel with the above-described operation, a data input signal BDin from an external terminal DB [0] is input to an I/O control circuit IOCB1. Upon level transition of the BWTE to 'H', the I/O control circuit IOCB1 amplifies the input signal. The column selection circuit CSELCB1 couples the output of the I/O control circuit IOCB1 to the bit line pair (/BBL [0], BBL [0]) corresponding to the CB [0] so that the BDin information is written into the selected memory cell MC. Thereafter, responding to the level transition of the decode start-up signal BTDEC from 'H' to 'L', the word line WL [0] which has been risen up is made fallen.

In the port B side writing (write) cycle T0, the proximal end (expressed by BWL [0]A) of the port B side word line BWL [0] is brought into the level 'H' likewise the first example. Thereafter, as described in the second embodiment and the first example, the level transition at the distal end of the port B side word line WLB0 (BWL [0]B) is enabled to 'H' by operating the boosting circuit BSTCB and the boosted potential supply circuit BSVSB0 after an elapse of the predetermined delay time although not shown in the drawing. Then the data BDin supplied to the data terminal DB[0] are written in the selected memory cell.

In the port A side writing (write) cycle T1 (T1:WR_A), upon rise-up of the clock signal CLKA, the control circuit CNTCA enables the level transition of the decode start-up signal ATDEC from 'L' to 'H'. The control circuit CNCA brings the internal write enable signal AWTE to the level 'H', and the internal read enable signal ARDE to the level 'L'. Upon level transition of the ATDEC to 'H', the pre-decoder PRIDEC generates the row selection signals RA [0], RGA [0], and the column selection signal CA [0]. The row selection drive circuit RDECD rises up the word line (AWL [0]) in accordance with the RA [0], RGA [0]. In parallel with the above-described operation, a data input signal Adin from the external terminal DA [0] is input to the I/O control circuit IOCA1. Upon level transition of the AWTE to 'H', the I/O control circuit IOCA1 amplifies the input signal. The column selection circuit CSELCA1 couples the output of the I/O control circuit IOCA1 to the bit line pair (/ABL[1], ABL[1]) in accordance with the CA [0]. In this way, the ADin information is written into the selected memory cell MC. Thereafter, the word line AWL [0] which has been risen up is made fallen upon level transition of the decode start-up signal ATDEC from 'H' to 'L'.

In the port B side read cycle T2 (T2:RD_B), upon rise-up of the clock signal CLKB, the control circuit CNTCB enables the level transition of the decode start-up signal BTDEC from 'L' to 'H'. The control circuit CNTCB brings the internal write enable signal BWTE to the level 'L', and the internal read enable signal BRDE to the level 'H'. Upon level transition of the BTDEC to 'H', the pre-decoder PRIDEC generates the row selection signals RB[0], RGB [0], and the column selection signal CB[0]. In this example, the row selection signals RB[0], RGB[0], and the word line BWL [0] are selected. The bit line pair (/BBL[1], BBL[1]) is selected by the column selection signal CB0. The row selection drive circuit RDECD rises up the word line BWL [0] in accordance with the RB[0], RGB[0]. The storage data in the respective memory cells MC coupled to the BWL [0] are read to the corresponding bit line pair. In this case, the read signal of the /BBL[1], BBL[1] will be transferred to the sense amplifier via the column selection circuit CSELCB1.

In parallel with the above-described operation, upon level transition of the decode start-up signal BTDEC to 'H', the transition of the sense amplifier enable signal BSAE is enabled to the effective state (level 'H'). The sense amplifier amplifies the read signal of the pair /BBL[1], BBL[1] transferred via the above-described column selection circuit CSELCB1, using the BSAE at the level 'H' as a trigger. The thus amplified signal is output to the external terminal QB[0] as a data output signal BDout via the I/O control circuit IOCB1. The word line BWL [0] which has been risen up is made fallen in response to the level transition of the decode start-up signal BTDEC from 'H' to 'L'.

In the port A side read cycle T3 (T3:RD_A), upon rise-up of the clock signal CLKA, the control circuit CNTCA enables the level transition of the decode start-up signal ATDEC from 'L' to 'H'. The control circuit CNTCA brings the internal write enable signal AWTE to the level 'L', and the internal read enable signal ARDE to the level 'H'. Upon the level transition of the ATDEC to 'H', the pre-decoder PRIDEC generates the row selection signals RA [0], RGA [0], and the column selection signal CA [0]. In this example, the row selection signals RA [0], RGA [0], and the word line AWL [0] are selected. The bit line pair (/ABL[0], ABL[0]) is selected by the column selection signal CA0. The row selection drive circuit RDECD rises up the word line AWL [0] in accordance with the RA [0], RGA [0]. Then the storage data of the respective memory cells MC coupled to the AWL [0] are read to the bit line pair. In this case, the read signal of the pair /ABL[0], ABL[0] will be transferred to the sense amplifier via the column selection circuit CSELCA1.

In parallel with the above-described operation, upon level transition of the decode start-up signal ATDEC to 'H', the transition of the sense amplifier enable signal ASAE is enabled to the effective state (level 'H'). The sense amplifier amplifies the read signal of the pair /ABL[0], ABL[0] transferred via the above-described column selection circuit CSELCA1, using the ASAE at the level 'H' as a trigger. The amplified signal is output to the external terminal QA [0] as the data output signal ADout via the I/O control circuit IOCA1. The word line AWL [0] which has been risen up is made fallen in response to the level transition of the decode start-up signal ATDEC from 'H' to 'L'.

Upon rise-up of the A port side word line (AWL [0]), the boosting circuit BSTCA and the boosted potential supply circuit BSVSA0 execute the following operations.

In the write cycle T1, in synchronization with the level transition of the internal write enable signal AWTE from 'L' to 'H', or in the read cycle T3, in synchronization with the level transition of the internal write enable signal ARDE from 'L' to 'H', the boosting circuit BSTCA enables the level transition of the PCGN from 'L' to 'H'. After an elapse of the predetermined time period, the level transition of the boosting start-up signal BST is enabled from 'L' to 'H'. Then the boosted voltage BTV is generated, and supplied to the boosted potential node wiring AWLUP. When the boosted potential supply circuit BSVSA0 allows the potential at the distal end B of the word line WL [0] reaches the logical threshold value of the inverter circuit INV2, the level transition of the output of the inverter circuit INV2 is enabled from 'H' to 'L'. Then the P channel MOSFET PT3 is brought into ON state, starting supply of the boosted voltage BTV of the boosted potential node wiring AWLUP to the distal end B of the word line WL [0]. The potential at the distal end B of the word line WL [0] is raised to the level 'H' like VDD.

Although not shown in FIG. 20, upon rise-up of the B port side word line (BWL [0]), the boosting circuit BSTCB and the boosted potential supply circuit BSVSB0 will execute operations similar to those executed by the boosting circuit BSTCA and the boosted potential supply circuit BSVSA0.

Therefore, the high potential level at the distal end B raised by the boosted potential BTV is kept at the potential level of the power supply voltage VDD without reaching the boosted potential BTV. Assuming that the signal level at the distal end B of the word line AWL [0] becomes equal to or higher than the VDD, the potential equal to or higher than the power supply voltage VDD will be absorbed into the first power supply voltage VDD as the low-impedance power supply because of the P channel MOSFET PT1 of the inverter circuit INV1 in the ON state for driving the proximal end A of the word line AWL [0] as shown in FIG. 8. Therefore, the word line potential is not raised to the excessively high voltage, preventing the memory cell data from being disrupted by the static noise margin (SNM).

As FIG. 20 shows, in the port A side writing (write) cycle T1, likewise the first example, the proximal end of the port A side word line AWL [0] (AWL [0]A) is brought into the level 'H'. Then, after an elapse of the predetermined time period, operations of the boosting circuit BSTCA and the boosted potential supply circuit BSVSA0 enable the level transition of the distal end of the port A side word line AWL [0] (AWL [0]B) to 'H'. In parallel with the above-described description, the proximal end (BWL [0]A) of the word line WL [0]B is brought into the level 'L'. At this time, the potential at the proximal end of the word line AWL [0] (AWL [0]A) will lower the signal level owing to the coupling capacity to the word line BWL [0]. That is, the inter-port interference may lower the potential level of the word line AWL [0]. However, operations of the boosting circuit BSTCA and the boosted potential supply circuit BSVSA0 minimize lowering of the signal level of the word line AWL0. Upon rise-up of the level at the distal end of the word line AWL [0] to 'H' from 'L', the word line AWL [0] (AWL [0]B) is brought into the level 'H'.

What is claimed is:

1. A semiconductor device comprising:
  a supply circuit for supplying a boosted voltage to a distal end of a wiring driven by a drive signal,
  wherein the supply circuit includes:
    an inverter circuit having an input directly coupled to the distal end of the wiring and an output directly coupled to a gate electrode of a switch element,
    wherein the switch element is controlled by an output signal of the inverter circuit, and
    wherein the switch element directly couples the boosted voltage to the distal end of the wiring.

2. The semiconductor device according to claim 1, further comprising:
  a boosting circuit including a capacitive element,
  wherein the boosted voltage is generated by using the capacitive element.

3. The semiconductor device according to claim 2, further comprising:
  a plurality of memory cells; and
  a word line driver,
  wherein the wiring is formed as a word line coupled to the plurality of memory cells,
  wherein the word line includes a proximal end and the distal end, and
  wherein the word line driver is coupled to the proximal end of the word line.

4. The semiconductor device according to claim 2, further comprising:
  a plurality of complementary data line pairs;
  a shared data line;
  a plurality of selection switches provided between the complementary data line pairs and the shared data line; and
  a column selection line driver,
  wherein the wiring is formed as a column selection line coupled to the selection switches,
  wherein the column selection line includes a proximal end and the distal end, and
  wherein the column selection line driver is coupled to the proximal end of the column selection line.

5. The semiconductor device according to claim 1, further comprising:
  a word line driver coupled to the distal end of the wiring; and
  a memory cell coupled to the wiring.

6. The semiconductor device according to claim 1,
  wherein the supply circuit, the wiring, the inverter circuit, and the switch element are included in a storage device,
  wherein the storage device has a quadrangular outer shape including a first side, a second side oppositely facing the first side, a third side extending between the first side and the second side, and a fourth side oppositely facing the third side,
  wherein the storage device includes a row selection drive circuit and a control circuit, which are arranged along the first side, a boosted potential supply circuit array including a plurality of the supply circuit, a boosted potential node wiring for supplying the boosted voltage, and a boosting circuit, which are arranged along the second side, a memory array including a memory cell, the memory array being disposed between the row selection drive circuit and the boosted potential supply circuit array, and a column selection circuit and an I/O control circuit, which are arranged between the memory array and the fourth side,
  wherein the column selection circuit is arranged between the memory array and the I/O control circuit,
  wherein the supply circuit is arranged between the I/O control circuit and the second side,
  wherein the boosted potential node wiring is arranged between the boosted potential supply circuit array and the second side,
  wherein the wiring is a word line,
  wherein the row selection drive circuit includes a word line driver coupled to the word line,
  wherein the switch element is a MOS switch element,
  wherein the output of the inverter circuit is coupled to a gate electrode of the MOS switch element,
  wherein the boosting circuit includes a first capacitive element for generating a boosted voltage, and
  wherein the MOS switch element supplies the boosted voltage that has been supplied via the boosted potential node wiring to the word line.

7. The semiconductor device according to claim 1, wherein the inverter circuit is comprised of a p-type MISFET and a n-type MISFET, and the input of the inverter circuit is coupled to each of a gate electrode of the p-type MISFET and a gate electrode of the n-type MISFET.

8. The semiconductor device according to claim 7, further comprising:
  a word line driver coupled to the distal end of the wiring; and
  a memory cell coupled to the wiring.

9. The semiconductor device according to claim 7,
  wherein the supply circuit, the wiring, the inverter circuit, and the switch element are included in a storage device,
  wherein the storage device has a quadrangular outer shape including a first side, a second side oppositely facing the first side, a third side extending between the first side and the second side, and a fourth side oppositely facing the third side,
  wherein the storage device includes a row selection drive circuit and a control circuit, which are arranged along the first side, a boosted potential supply circuit array including a plurality of the supply circuit, a boosted potential node wiring for supplying the boosted voltage, and a boosting circuit, which are arranged along the second side, a memory array including a memory cell, the memory array being disposed between the row selection drive circuit and the boosted potential supply circuit array, and a column selection circuit and an I/O control circuit, which are arranged between the memory array and the fourth side,
wherein the column selection circuit is arranged between the memory array and the I/O control circuit,
wherein the supply circuit is arranged between the I/O control circuit and the second side,
wherein the boosted potential node wiring is arranged between the boosted potential supply circuit array and the second side,
wherein the wiring is a word line,
wherein the row selection drive circuit includes a word line driver coupled to the word line,
wherein the switch element is a MOS switch element,
wherein the output of the inverter circuit is coupled to a gate electrode of the MOS switch element,
wherein the boosting circuit includes a first capacitive element for generating a boosted voltage, and
wherein the MOS switch element supplies the boosted voltage that has been supplied via the boosted potential node wiring to the word line.

* * * * *